(12) United States Patent
Takahashi et al.

(10) Patent No.: US 7,299,398 B2
(45) Date of Patent: Nov. 20, 2007

(54) DATA GENERATING METHOD FOR FORMING DESIRED CRC CODE

(75) Inventors: Fumio Takahashi, Kawasaki (JP); Akihiro Shiratori, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 589 days.

(21) Appl. No.: 10/765,191

(22) Filed: Jan. 28, 2004

(65) Prior Publication Data
US 2004/0187064 A1 Sep. 23, 2004

(30) Foreign Application Priority Data
Jan. 28, 2003 (JP) .............. 2003-019413

(51) Int. Cl.
*H03M 13/00* (2006.01)
(52) U.S. Cl. .............. 714/752; 714/708; 714/757; 714/807
(58) Field of Classification Search .............. 714/781, 714/786, 708, 785, 758, 774, 807, 757
See application file for complete search history.

(56) References Cited

U.S. PATENT DOCUMENTS 4,941,144 A * 7/1990 Mizukami .............. 714/708
5,379,289 A * 1/1995 DeSouza et al. .............. 370/230
6,609,225 B1 * 8/2003 Ng .............. 714/781
6,766,493 B1 * 7/2004 Hoffman et al. .............. 714/785

FOREIGN PATENT DOCUMENTS

JP 2001-244820 9/2001

* cited by examiner

*Primary Examiner*—Cynthia Britt
*Assistant Examiner*—Fritz Alphonse
(74) *Attorney, Agent, or Firm*—Young & Thompson

(57) ABSTRACT

A method of generating a CRC code to determine a variable field value for equalizing a CRC value, which is calculated based on data including the variable field value of a variable field included in a data field according to a generator polynomial, to a desired CRC value, comprises the steps of establishing a temporary variable field value, reading all corrective values which correspond to a bit number where a bit value of said temporary variable field value is "1", from a conversion table which stores therein corrective values for indicating a bit to be inverted in the variable field value as "1" corresponding to a predetermined bit number, and exclusive-ORing the read corrective values to calculate a first calculated value, and, determining whether the first calculated value corresponds to the desired CRC value or not.

21 Claims, 15 Drawing Sheets

DATA GENERATING METHOD FOR FORMING DESIRED CRC CODE

BACKGROUND OF THE INVENTION

1. Field of the Invention

The present invention relates to a method of generating a CRC (Cyclic Redundancy Check) code, and more particularly to a CRC code generating method which is capable of generating a desired CRC code by changing a portion of data.

2. Description of the Related Art

In serial communications performed over cables, a voltage level may possibly suffer a drift due to a low-frequency component when a succession of data having the same voltage level occurs. To prevent such a drift, there is employed a technique called bit stuffing which, when a succession of "1s" or "0s" occurs in data to be transmitted, inserts a bit having a logic value that is opposite to the logic values in succession. For example, according to a USB data packet format that is used for a USB (Universal Serial Bus) which is known as a typical serial transmission application, it is stipulated that if a succession of seven "1s" occurs in data to be transmitted, then "0" is to be inserted after the sixth "1" in the data to be transmitted to the bus. It is also stipulated as an exception for the above provision that if a succession of seven "1s" occurs in data transmitted over a bus, then it represents an EOF (End Of Frame).

In serial communications, a CRC (Cyclic Redundancy Check) code is used to detect an error that may be caused in the transmission of data. For serial communications, there is generally used a frame format comprising a CRC field and an EOF in succession at the end of a frame which is made up of a bunch of data flowing through a network.

For conducting a transmission and reception test using a CRC code, as described in paragraph [0003] to [0006]of Japanese Patent Laid-open Application No. 2001-244820 (JP P2001-244820A), a predetermined generator polynomial is used on data in each frame unit on the transmission side to calculate a CRC code, and the calculated CRC code is added to the data to be transmitted and then transmitted. On the reception side, the received data is divided using the same generator polynomial as the one used on the transmission side, and if a residue is produced, then it is determined that an error has occurred in the transmitted data.

For conducting a test to determine whether a packet is properly transmitted and received between a transmitting apparatus and a receiving apparatus or not, it is preferable if an arbitrary code can be set in a CRC field. For performing face-to-face communications (bidirectional communications) with a product developed by a different maker (manufacturer), it is necessary to generate an arbitrary CRC code for the purpose of confirming whether proper functions of the both parties are achieved or not.

FIG. 1 shows an exemplary arrangement of a serial communication system. As shown in FIG. 1, transmitting apparatus 1 and receiving apparatus 8 are connected to each other by transmission path 9. Transmitting apparatus 1 transmits serial transmission data TD to transmission path 9, from which serial transmission data TD is received by receiving apparatus 8.

FIG. 2 shows an example of an arrangement of transmitting apparatus 1. As shown in FIG. 2, transmitting apparatus 1 comprises CPU (central processing unit) 92, memory 93 for storing data therein, and serial transmitting unit 94 for transmitting data from CPU 92 as serial transmission data TD to the transmission path.

FIG. 3A shows, by way of example, an arrangement of a transmission frame which is transmitted as serial transmission data TD. The transmission frame comprises data field 141, CRC field 142 for storing a CRC code which is generated based on the data of data field 141, and EOF field 143 following CRC field 142. In FIG. 3A, the CRC code appended in CRC field 142 represents "0001". The CRC code will also be hereinafter referred to as "CRC value."

It is assumed that, as shown in FIG. 3B, the value "0001" of CRC field 142 is replaced with a desired value, e.g., "1011", and then transmitted. In this case, transmitting apparatus 1 shown in FIG. 2 operates according to an operation sequence represented by a flowchart shown in FIG. 4. In step 201, data is stored in memory 93. In step 202, the data is read from memory 93. In step 203, a CRC value corresponding to the read data is calculated according to a predetermined generator polynomial. Thereafter, in step 204, the calculated CRC value is replaced with a desired CRC value. In step 205, the fields are combined in the order described above, making a frame which is transmitted. When the CRC value is thus replaced, the receiving apparatus detects an unmatched CRC error, which prevents a normal test from being conducted. In a face-to-face test for transmitting and receiving a frame between apparatus which are connected to each other, when a CRC error occurs, an error process immediately follows. Therefore, if the value of the CRC field is simply replaced with a desired value, then it is not possible to confirm a process to be performed after normal transmission and reception of data has been confirmed.

To solve the above problem, there has been employed a process of providing a variable field where data can be changed in a data field and CRC calculations are repeated one by one while changing the data of the variable field until the CRC value becomes a desired value, as shown in FIGS. 5A and 5B. FIG. 5A shows a transmission frame made up of data field 21, CRC field 23, and EOF field 24, data field 21 containing variable field 22. The value of variable field 22 is "0000", and the value of CRC field 23 is "0001" accordingly. In order to equalize the value of CRC field 23 to "1011" as shown in FIG. 5B, CRC calculations are repeated to search for the value "0101" of variable field 22, and the value that has been searched for is stored in variable field 22.

FIG. 6 is a flowchart of a sequence of such a process of generating a CRC code.

In step 211 shown in FIG. 6, transmitting apparatus 1 sets a variable field value X to "0" in variable field 22. If the variable field length is represented by 4 bits, then the variable field value X is set to "0000" in variable field 22. In step 212, data is stored in memory 93. In step 213, the data is read from memory 93. In step 214, CPU 92 calculates a CRC value corresponding to the read data. In step 215, CPU 92 determines whether the CRC value calculated in step 214 is equal to a desired CRC value or not. If not equal, then control goes to step 216. In step S16, "1" is added to the variable field value X. Then, control returns to step 214. If the calculated CRC value is judged as being equal to the desired CRC value in step 215, then control goes to step 217. In step 217, fields are combined in a predetermined order, producing a frame, and the frame is transmitted.

With the sequence shown in FIG. 6, however, a CRC value has to be recalculated each time the variable field value X is incremented. Consequently, it is highly time-consuming to obtain a frame having a desired CRC value.

SUMMARY OF THE INVENTION

It is an object of the present invention to provide a CRC code generating method which is capable of generating at a high speed a transmission frame having a desired CRC value.

According to a first aspect of the present invention, there is provided a method of generating a CRC code to determine a variable field value for equalizing a CRC value, which is calculated based on data including the variable field value of a variable field included in a data field according to a generator polynomial, to a desired CRC value, comprising the steps of establishing a temporary variable field value, reading all corrective values which correspond to a bit number where the bit value of the temporary variable field value is 1, from a conversion table which stores therein corrective values for indicating a bit to be inverted in the variable field value as "1" corresponding to a predetermined bit number, and exclusive-ORing the read corrective values to calculate a first calculated value, and, when the first calculated value corresponds to the desired CRC value, determining the temporary variable field value to be a variable field value for obtaining the desired CRC value.

According to a second aspect of the present invention, there is provided a method of generating a CRC code to determine a variable field value for equalizing a CRC value, which is calculated based on data including the variable field value of a variable field included in a data field according to a generator polynomial, to a desired CRC value, comprising the steps of establishing a temporary variable field value, reading a first calculated value corresponding to the temporary variable field value from a conversion table which stores therein first calculated values corresponding to a variable field value X and produced by exclusive-ORing a CRC value where the variable field value is 0 and a CRC value where the variable field value is X, where X represents an integer equal to or greater than 1 and equal to or less than $2^K-1$ where K represents the bit length of the variable field, and, when the read first calculated value corresponds to the desired CRC value, determining the temporary variable field value to be a variable field value for obtaining the desired CRC value.

According to a third aspect of the present invention, there is provided a method of generating a CRC code to determine a variable field value for equalizing a CRC value, which is calculated based on data including the variable field value of a variable field included in a data field according to a generator polynomial, to a desired CRC value, comprising the steps of calculating a first calculated value by exclusive-ORing a CRC value where the variable field value is 0 and the desired CRC value, and reading a variable field value corresponding to a second calculated value equal to the first calculated value, as a variable field value for obtaining the desired CRC value, from a conversion table which stores therein variable field values X corresponding to second calculated values, wherein each of the second calculated value is produced by exclusive-ORing a CRC value where the variable field value is 0 and a CRC value where the variable field value is X, where X represents an integer equal to or greater than 1 and equal to or less than $2^K-1$ where K represents the bit length of the variable field.

The above and other objects, features, and advantages of the present invention will become apparent from the following description with reference to the accompanying drawings which illustrate examples of the present invention.

DETAILED DESCRIPTION OF THE INVENTION

Figure 7:
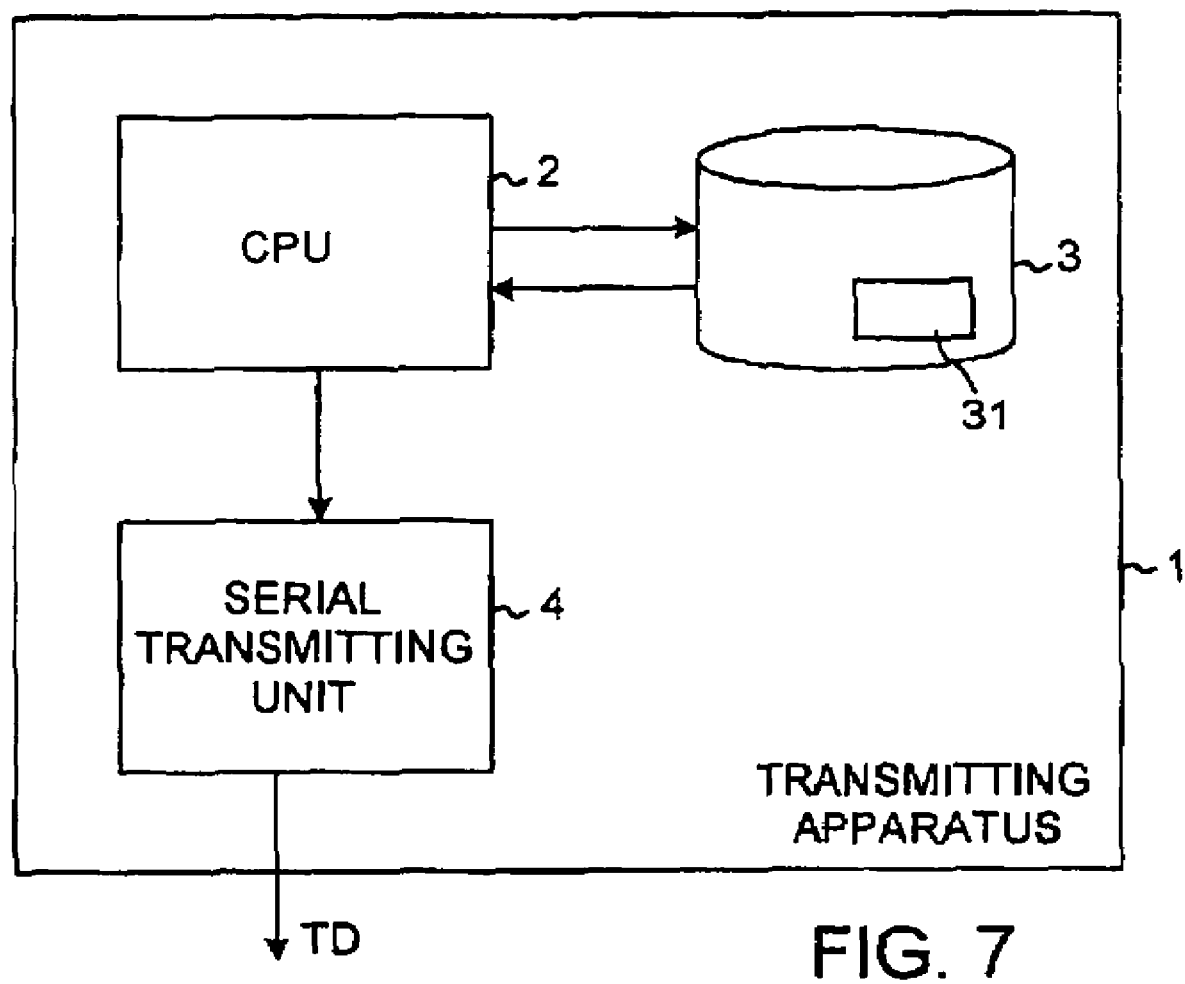
FIG. 7 is a block diagram showing a transmitting apparatus to which a CRC code generating method according to the present invention is applied.

FIG. 7 shows in block form an example of a basic arrangement of transmitting apparatus 1 to which a CRC code generating method according to the present invention is applied.

Figure 1:
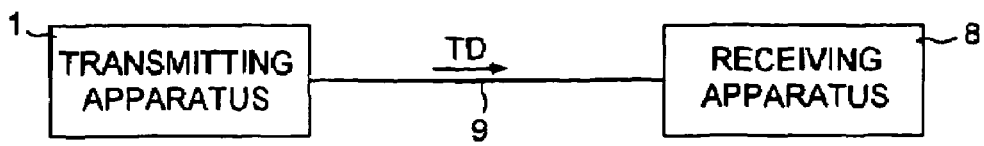
FIG. 1 is a block diagram showing an exemplary arrangement of a serial communication system.
Figure 2:
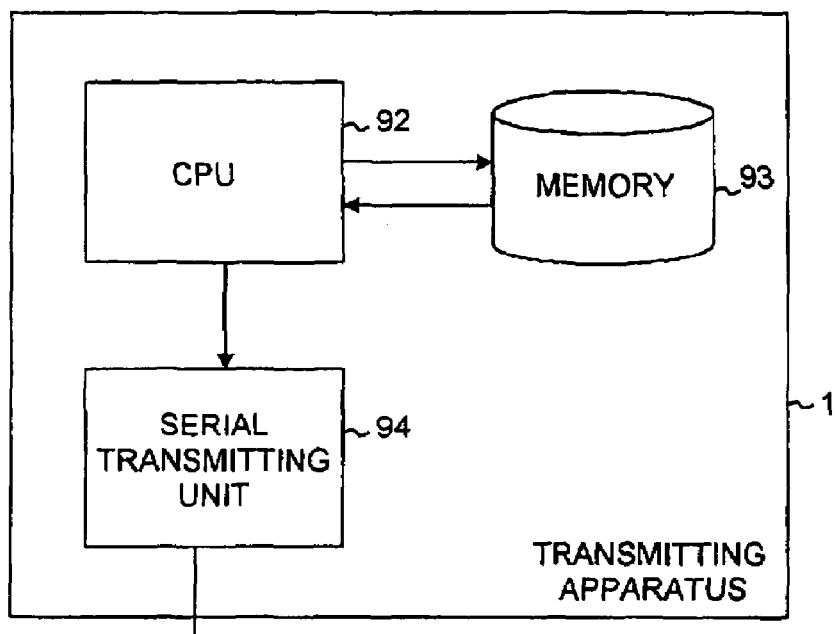
FIG. 2 is a block diagram showing a basic arrangement of a transmitting apparatus.
Figure 3A:
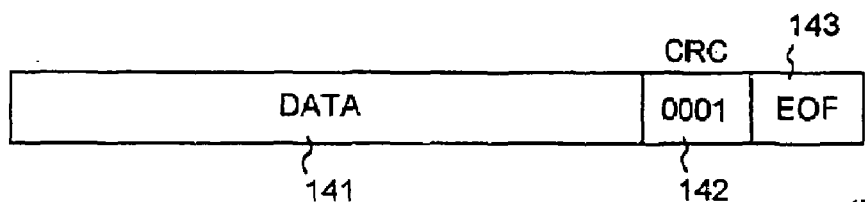
FIG. 3A is a diagram showing a transmission frame.
Figure 3B:
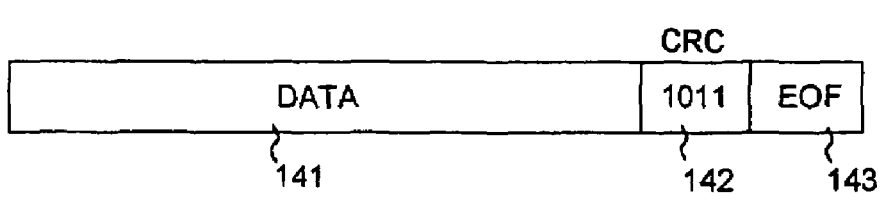
FIG. 3B is a diagram showing a transmission frame in which the value of a CRC field has been replaced with a desired CRC value.
Figure 4:
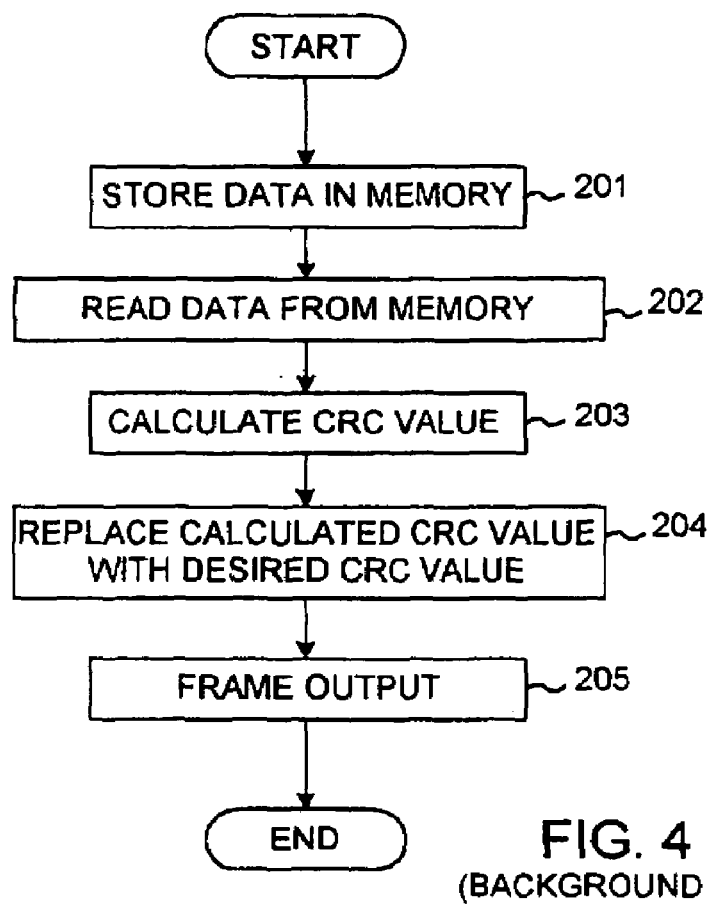
FIG. 4 is a flowchart showing a process for simply replacing the value of a CRC field with a desired CRC value.

As shown in FIG. 7, transmitting apparatus 1 comprises memory 3 for storing a control program of transmitting apparatus 1 and transmission data, CPU 2 for calculating a CRC value and controlling the output of a transmission frame according to the control program, and serial transmitting unit 4 for outputting the transmission frame as transmission data TD to a serial communication network. Transmitting apparatus 1 shown in FIG. 7 is the same as transmitting apparatus shown in FIG. 2 in that it has CPU 2, memory 3, and serial transmitting unit 4. However, transmitting apparatus 1 shown in FIG. 7 is different from transmitting apparatus shown in FIG. 2 in that memory 3 has CRC conversion table 31 therein. In transmitting apparatus 1 shown in FIG. 7, CPU 2 searches for a variable field value using CRC conversion table 31, and generates transmission data TD having a desired CRC value.

Figure 5A:
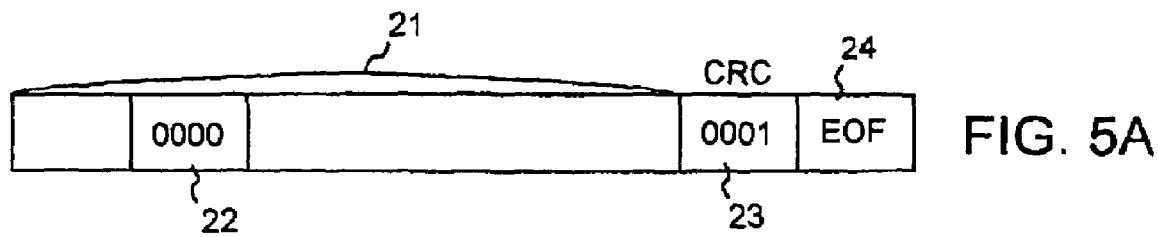
FIG. 5A is a diagram showing a transmission frame in which a variable field value X is an initial value "0"
Figure 5B:
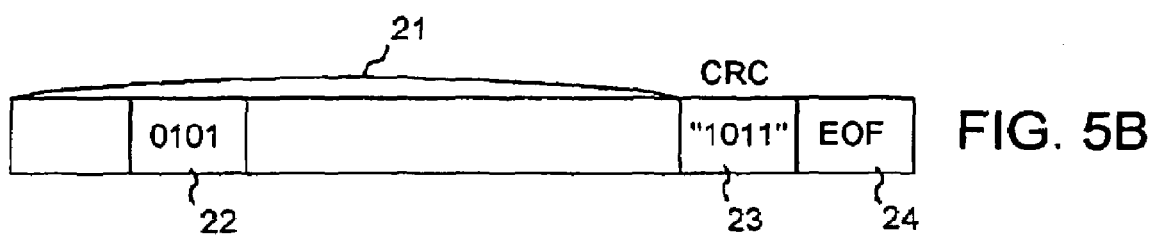
FIG. 5B is a diagram showing a transmission frame in which a variable field value required to equalize the value of a CRC field to the desired CRC value has been generated.

The transmission frame according to the present invention is of the same arrangement as the transmission frame shown in FIGS. 5A and 5B, and has data field 21, CRC field 23, and EOF field 24, with variable field 22 whose data can be changed being contained in data field 21. FIG. 5A shows a transmission frame in which the variable field value X is an initial value "0". If the variable field length is represented by 4 bits, then "0000," is stored in variable field 22. If a desired CRC value, e.g., "1011", is set in CRC field 23, then FIG. 5B shows a transmission frame after a variable field value X ("0101" in this example) required to store a value corresponding to the desired CRC value in CRC field 23 has been generated.

With the CRC code generating method according to the present invention, a CRC is mathematically determined by a residue produced when the value of an input sequence is divided by a generator polynomial. In the world of mod 2 (an algorithm to modulus 2), the CRC code generating method is based on the fact that a division is expressed as an XOR per bit and the bits of a CRC that are affected if a particular bit value of an input sequence is changed depend on the bit length L of the data field of the input sequence and its bit number N, but not on the input sequence itself.

This CRC value is obtained by a CRC calculation on the data field of the frame using a generator polynomial. First, a CRC value $C_0$ corresponding to the case of the variable field value being the initial value "0", and a calculated value A is obtained by XORing the CRC value $C_0$ and the desired CRC value $C_T$. If A=0, both values $C_0$ and $C_T$ agree with each other and the variable field in the case of the initial value "0" is the value to be obtained. If the both CRC values are different from each other, it is necessary to determine a variable field value which equalizes both CRC values to each other. The bit positions in the calculated value A where the bit value thereof is "1" indicate the data of bit positions at which bits of the $C_0$ should be changed to equalize the $C_0$, which is a CRC value, with the desired CRC value $C_T$.

Consequently, each CRC value in the case that each bit position ($2^N$) in the variable field is changed is calculated, and the XORed value between each calculated CRC value and the CRC value $C_0$ which corresponds to the case where the variable filed is in the initial value "0". This calculation result indicates the bit position in the calculated CRC value which is changed from the $C_0$, and this data position is referred as "altering bit position." The altering bit position data is obtained for each bit position ($2^N$) of the variable field and is stored as a corrective value E in a table (CRC conversion table) with an address represented by each bit position.

Next, what value of the variable field makes the "altering bit position data equal to the "data of bit position which is desired to be changed from $C_0$" is determined. The variable field value which makes the former equals to the latter is the variable field value providing the desired CRC value.

First, the variable field is incremented from the initial value "0," and the corrective value E corresponds to the bit position at which a bit of "1" appears in the variable field is read from the table. Then the XORing operation on all the read corrective values are carried out. If only one bit is "1", the XORing operation is not carried out and the single corrective value thus read from the table is treated as the calculation result.

The bit of "1" in the corrective value E indicates the bit position where a CRC value changes. When the bit value of the same bit position changed at an even-number of times, the bit value is changed back to the original value. So, the XORing operation is carried out to maintain the bit of "1" only at the position where the bit in the CRC is changed at an odd-number of times.

The calculated value B thus obtained corresponding to the variable field value indicates the data of a bit position at which the variable field is changed from the CRC value at the time of the initial value "0". Then, the altering bit position data is obtained for each variable field value by sequentially incrementing the variable field from the initial value of "0." Next, it is detected whether the "altering bit position data" is matched to the "data of bit position which is desired to be changed from $C_0$" or not by, for example, XORing the both data. The variable field value at the time both value coincide with each other is a variable field value for obtaining the desired CRC value.

Next, the generation of CRC conversion table 47 will be described below with reference to FIG. 10 using a specific example. A corrective value E is calculated in advance by XORing a CRC value which is generated in association with data whose variable field value X is $2^N$ and a CRC value which is generated in association with data whose variable field value X is X=0. For example, a corrective value $E_0$ corresponding to L=$16_D$ and N=$0_D$ is calculated as $E_0$="1101" by XORing a CRC value $C_1$ (="1100") calculated such that the variable field value X of transmission frame 41 is $2^0$ (="0001") and a CRC value $C_0$ (="0001") calculated such that the variable field value X of transmission frame 41 is "0000". A corrective value $E_1$ corresponding to L=$16_D$ and N=$1_D$, a corrective value $E_2$ corresponding to L=$16_D$ and N=$2_D$, and a corrective value $E_3$ corresponding to L=$16_D$ and N=$3_D$ are similarly calculated, generating CRC conversion table 47.

A CRC code generating process according to a first embodiment of the present invention will be described below with reference to FIG. 8. Transmitting apparatus 1 carries out the steps described below to generate and output transmission data TD having a desired CRC value.

In step 221, a variable field value X of a transmission field is initialized to "0". Thereafter, in step 222, data is stored in memory 3. In step 223, the data is read from memory 3. In step 224, CPU 2 calculates a CRC value corresponding to the transmission data according to a generator polynomial. In step 225, CPU 2 exclusive-ORs the CRC value corresponding to the transmission data with the variable field value X being "0" and the desired CRC value, and saves the calculated result as a calculated value A. In the description which follows, the term "exclusive-OR" is referred to as "XOR".

In step 226, CPU 2 determines whether the calculated value A is 0 or not. If the calculated value A is 0, then since the desired CRC value has been obtained, control jumps to step 230. If the calculated value A is not 0, then control goes to step 227.

In step 227, CPU 2 increments the variable field value X to establish data for use temporarily as the variable field value X in following steps. In step 228, CPU 2 accesses CRC conversion table 31 in memory 3 using an address represented by the data length L, i.e., the bit length (data length) L of the data field, and a bit number N corresponding to a bit representation "1" in the variable field value X. CPU 2 reads corrective values E stored in all the corresponding addresses in CRC conversion table 31, and XORs the read corrective values E to produce a calculated value B. After having produced the calculated value B, CPU 2 compares the calculated value B with the calculated value A in step 229. If the calculated value B is equal to the calculated value A, then control goes to step 230. If the calculated value B is not equal to the calculated value A, then control goes back to step 227.

In step 230, the data is output in the sequence of the transmission frame to serial transmitting unit 4 under the control of CPU 2. As a result, the serial transmission data TD is transmitted from serial transmitting unit 4 to a serial transmission path.

Figure 9:
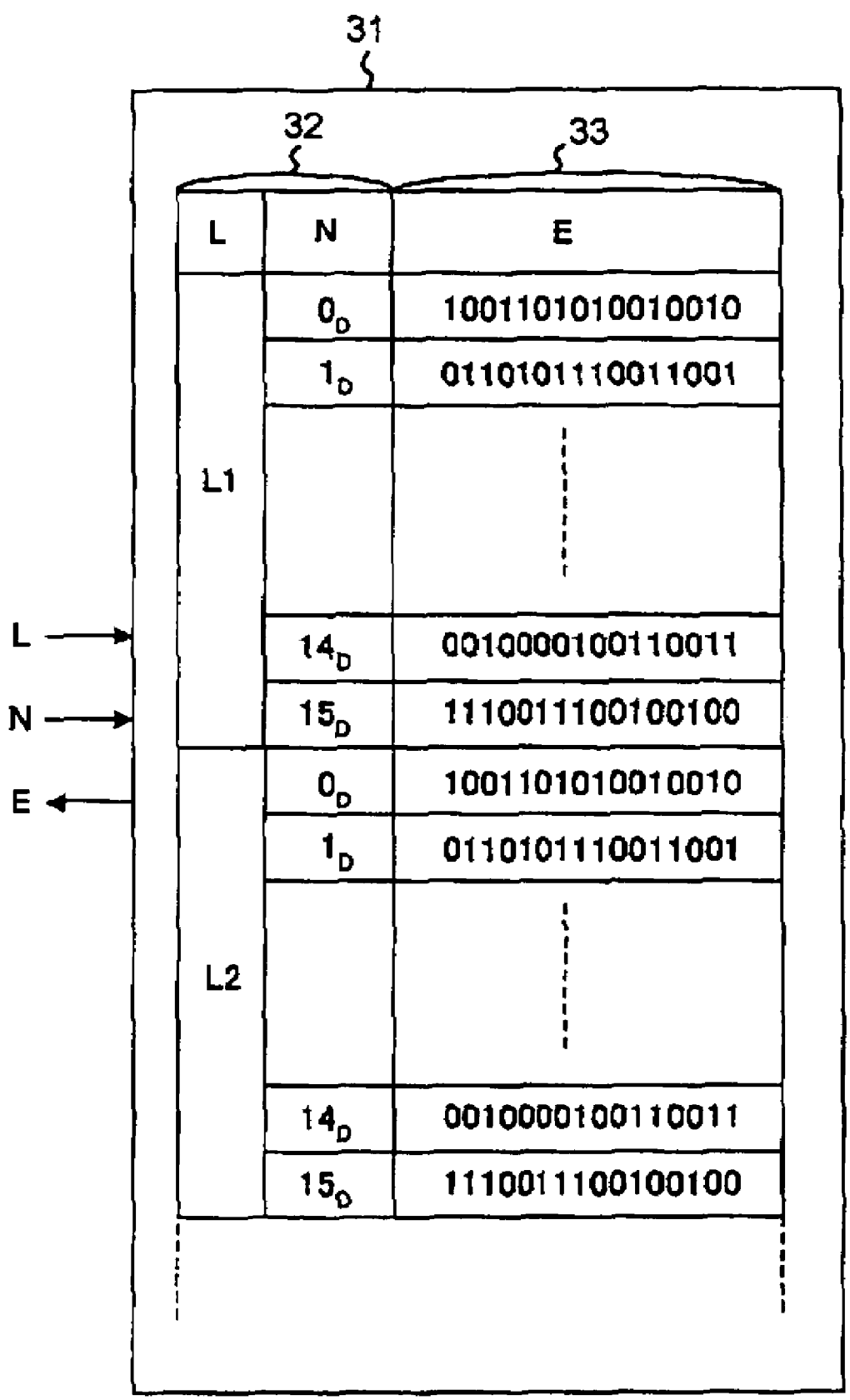
FIG. 9 is a diagram showing an example of a CRC conversion table used in the case of a variable field of a 16-bit length in the first embodiment.

CRC conversion table 31 will be described in detail below. FIG. 9 shows by way of example an arrangement of CRC conversion table 31 where the variable field is 16 bits long. In FIG. 9, CRC conversion table 31 contains indexes 32 of addresses corresponding to bit lengths L of the data fields and bit numbers N of the variable fields that are input. CRC conversion table 31 also contains fields 33 of corrective value data E at the respective addresses. Corrected value data E serve to indicate a bit to be inverted in a variable field value X as "1", and are output from CRC conversion table 31. For example, if 4-bit data "1010" according to the little-endian architecture is read as corrective value E, then the 4th and 2nd bits of the variable field value X are inverted to produce the calculated value B. Stated otherwise, the calculated value B is produced by XORing the variable field value X and the read corrective value B.

In FIG. 9, CRC conversion table 31 contains a plurality of low-level tables where corrective values E are stored as corrective value data 33 in association with respective bit numbers N corresponding to low-order addresses. One of the low-level tables is selected depending on the bit length L of a data field which corresponds to a high-order address. With CRC conversion table 31 being thus arranged, a plurality of data having different bit lengths can be processed without the need for generating a new table. A bit number N is an integer that is equal to or greater than 0 and less than the bit length of the variable field, a corrective value E is then calculated in advance by XORing a CRC value which is generated in association with data whose variable field value X is $2^N$ and a CRC value which is generated in association with data whose variable field value X is 0, and stored in CRC conversion table 31. These CRC values have been calculated according to a predetermined generator polynomial. In FIG. 9, the suffix D of, for example, $16_D$ representing a bit length L and $0_D$ representing bit numbers represents the decimal notation.

Figure 10:
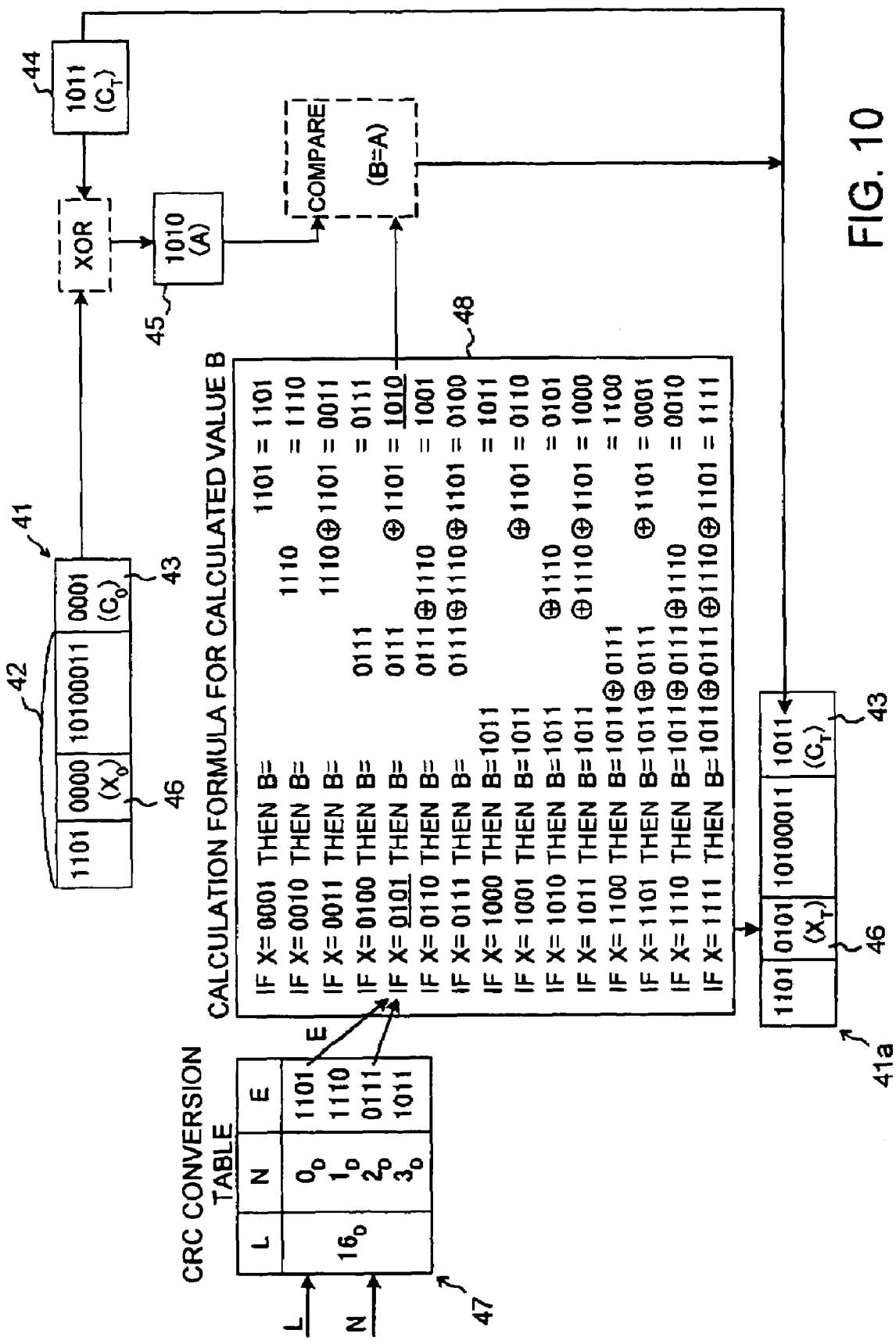
FIG. 10 is a diagram illustrative of the CRC code generating process according to the first embodiment.

FIG. 10 shows processing details and data flows in the steps of the CRC code generating process. It is assumed for the sake of brevity in FIG. 10 that transmission frame 41 contains data field 42 having a bit length L of 16 bits and CRC field 43 having a bit length L of 4 bits. Data field 42 includes variable field 46 having a length of 4 bits which occupy 4th to 7th bits of transmission frame 41 if its leading bit is the 0th bit. The EOF field is omitted from illustration in FIG. 10 as it has no bearing on the CRC code generating process.

The CRC code generating process will be described in detail below with reference to a comparison between FIG. 8 and FIG. 10.

Figure 8:
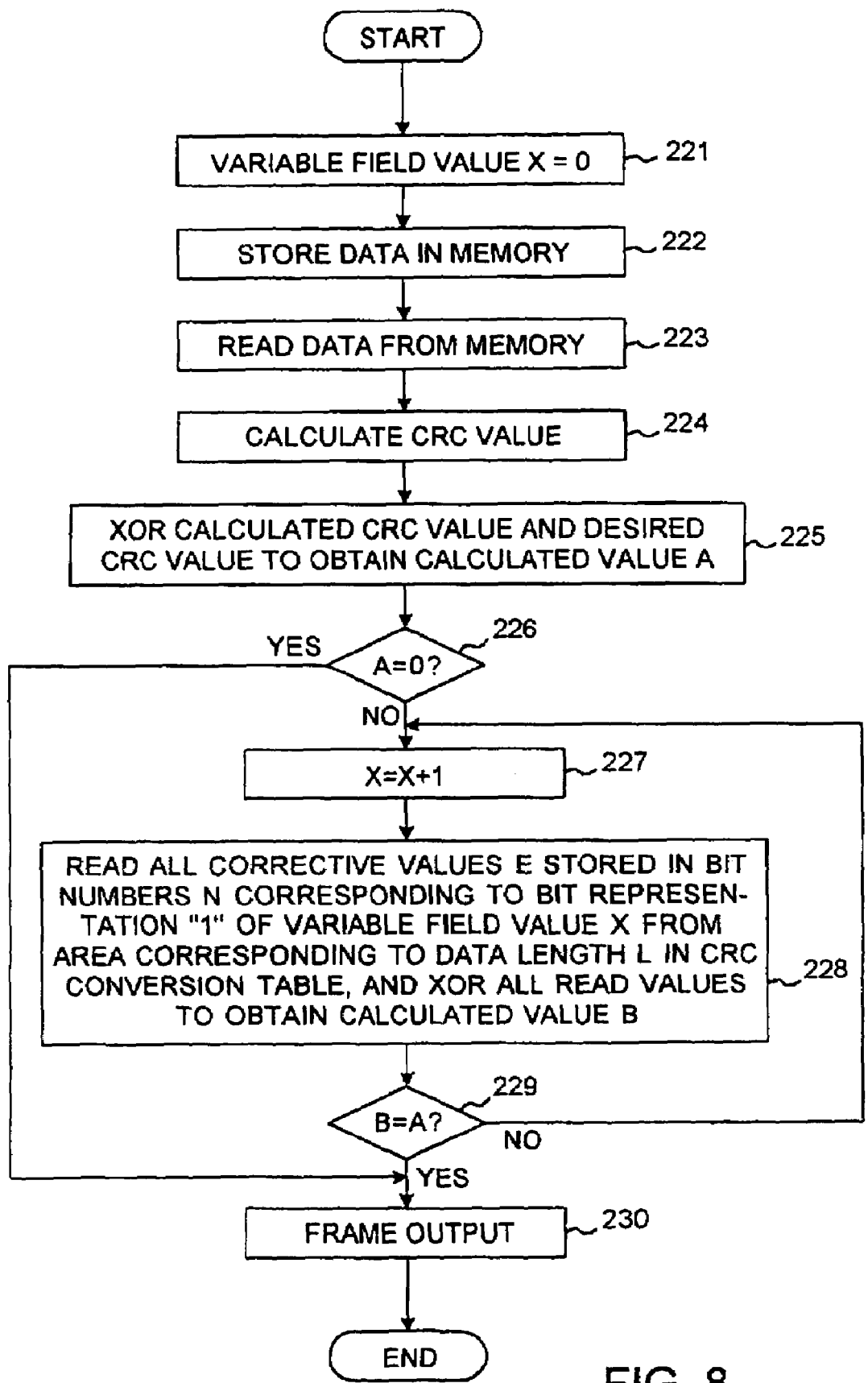
FIG. 8 is a flowchart showing a CRC code generating process according to a first embodiment of the present invention.

When steps 221 to 224 shown in FIG. 8 have been executed, the variable field value X of variable field 46 of transmission frame 41 is an initial value $X_0$ (="0000") and the CRC value of CRC field 43 thereof which is calculated based on the data of data field 42 according to the generator polynomial is $C_0$ (="0001"), as shown in FIG. 10.

Since the calculated value A is not "0000" in step 226, control goes to step 227. In step 227, the variable field value X is incremented to X="0001".

If desired CRC value 44 is $C_T$ (="1011"), then the calculated value A (45) determined by XORing $C_0$ and $C_T$ is "1010" in step 225. If the calculated value A is "0000", $C_0$ and $C_T$ agree with each other. Therefore, $X_T$ is the variable field value to be obtained. However, at this time, the calculated value A indicates that th second and fourth bits of $C_0$ differ from those of $C_T$. So an operation for obtaining the variable field value which changes each of the second and fourth bits of $C_0$ to "0" is carried out on and after step 227.

In step 228, the CRC conversion table in memory 3 is accessed using addresses represented by the data length L of the data field and the bit numbers N corresponding to the bit representation "1" in the variable field value X, and the corrective values E stored at all the addresses are read and XORed to produce a calculated value B. In the illustrated example, since X="0001", i.e., only the least significant bit of the variable field is "1", "1101" is read as the corrective value E corresponding to the bit number N=$0_D$ from CRC conversion table 47. Then, a calculated value B="1101" corresponding to X="0001" is calculated according to pre-programmed formula 48 for the calculated value B. More specifically, the bit values of the initial value $X_0$ (="0000") of the variable field value which correspond to the first, third, and fourth bits, which are of "1", of the read corrective value E (="1101") are inverted to produce the calculated value B="1101". Stated otherwise, the calculated value B is calculated by XORing the initial value $X_0$ and the corrective value E, and the corrective value E itself becomes the calculated value B because the initial value $X_0$ is "0000".

As the calculated value B (="1101") is not equal to the calculated value A (="1010") in step 229, control returns from step 229 to step 227.

When steps 227 to 229 are executed in the second cycle, the variable field value X becomes "0010", and since only the second bit thereof is "1", "1110" is read as a corrective value E corresponding to a bit number N=$1_D$ from CRC conversion table 47. A calculated value B (="1110") corresponding to X="0010" is calculated according to formula 48 for the calculated value B. Inasmuch as the calculated value B is not equal to the calculated value A, control goes back to step 227 again.

When steps 227 to 229 are executed in the third cycle, the variable field value X becomes "0011", and since the first and second bits thereof are "1", "1101' is read as a corrective value E corresponding to a bit number N=$0_D$ from CRC conversion table 47, and "0111" is read as a corrective value E corresponding to a bit number N=$1_D$ from CRC conversion table 47. The two read corrective values E are XORed and a calculated value B (="0011") corresponding to X="0011" is calculated according to formula 48 for the calculated value B. Inasmuch as the calculated value B is not equal to the calculated value A, control goes back to step 227 again.

Similarly, the processing from steps 227 to 229 is repeated. When steps 227 to 229 are executed in the fifth cycle, the variable field value X becomes "0101", and since the first and third bits thereof from the low-order position are "1", "1101" is read as a corrective value E corresponding to a bit number N=$0_D$ from CRC conversion table 47, and "0111" is read as a corrective value E corresponding to a bit number N=$2_D$ from CRC conversion table 47. The two read corrective values E are XORed and a calculated value B (="1010") corresponding to X="0101" is calculated according to formula 48 for the calculated value B. Since the calculated value B is judged as being equal to the calculated value A in step 229, the variable field value X at this time is set to a variable field value $X_T$ corresponding to a desired CRC value $C_T$(="1011"), and control goes to step 230. In step 230, the data of variable field 46 in transmission frame 41 is replaced with $X_T$ (="0101"), the CRC value of CRC field 43 is replaced with the desired CRC value $C_T$(="1011"), and the entire data are output as transmission frame 41a.

According to the first embodiment, as described above, a variable field value $X_T$ corresponding to a desired CRC value $C_T$ can be determined such that the desired CRC value $C_T$ and the data of data field 42 will not conflict with each other and an unmatched error will not be caused.

By generating in advance CRC conversion table 47 for each bit length of a data field, it is possible to obtain a variable field value $X_T$ corresponding to an arbitrary desired CRC value $C_T$ with respect to arbitrary data (data other than variable field 46 of data field 42) and the desired CRC value $C_T$, in the manner described above with reference to FIG. 10.

How much the calculation time for the CRC code generating process is shortened by the present embodiment will be reviewed below.

Figure 6:
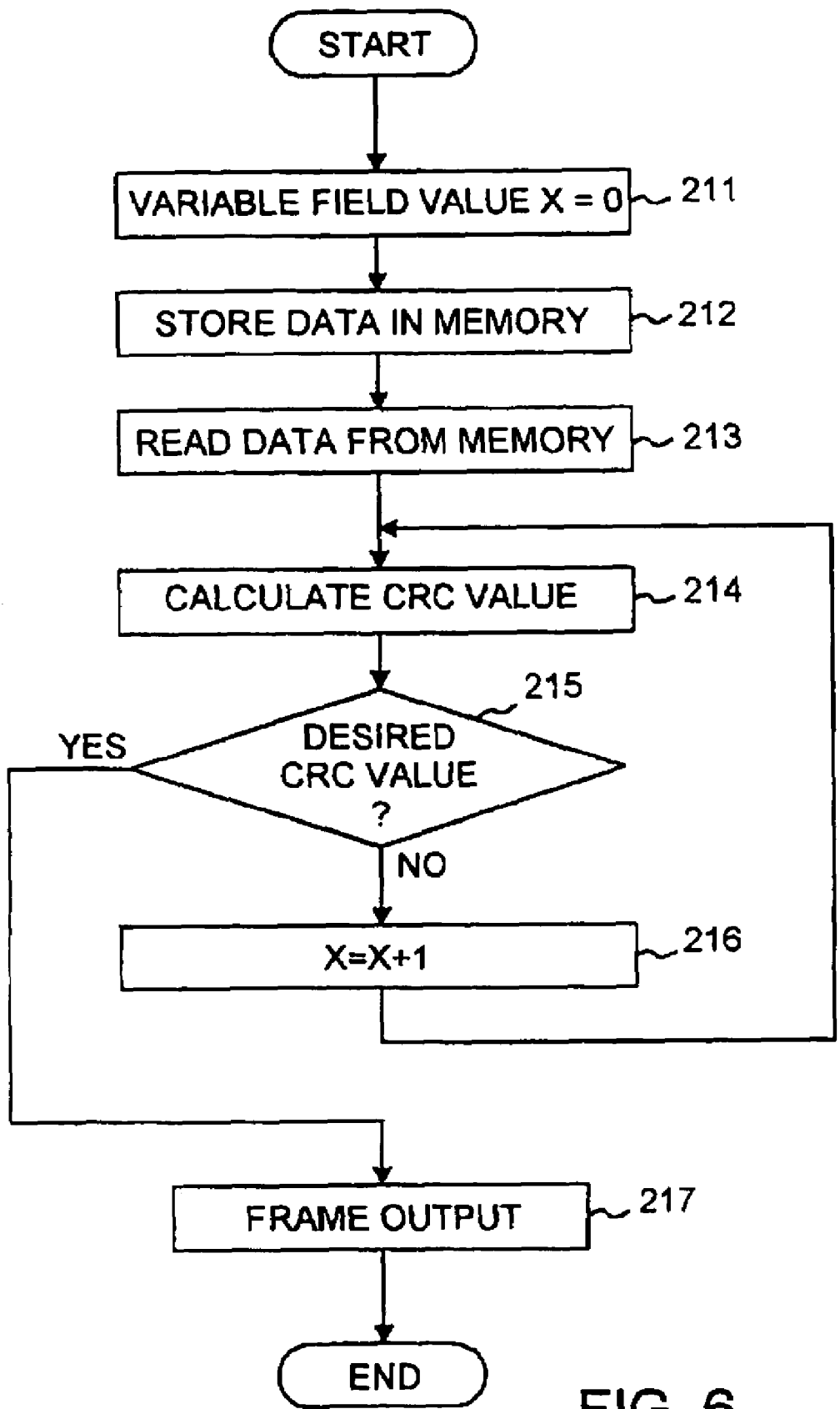
FIG. 6 is a flowchart showing a process for providing a variable field in a data field to prevent data and the desired CRC value from being unmatched.

A time $T_0$ that is required to obtain a variable field value $X_T$ corresponding to a desired CRC value $C_T$ according to the conventional sequence shown in FIG. 6 is estimated by:

$$T_0 = T_R + T_C * M$$

where $T_R$ represents a time to read data from memory 3, $T_C$ a time required to calculate a CRC value once, and M the number of repetitions required to obtain a calculated value B which matches a calculated value A.

A time $T_1$ that is required to obtain a variable field value $X_T$ corresponding to a desired CRC value $C_T$ according to the present embodiment is estimated by:

$$T_1 = T_R + T_C + T_L * M$$

where $T_L$ represents a time required to calculate a variable field value $X_T$ corresponding to a desired CRC value $C_T$ using the CRC conversion table.

Transmission data comprising the data of 1 k words (i.e., 1024 words) and a 16-bit CRC added thereto will be reviewed below. It is assumed that a variable field length is represented by 16 bits. If $T_R$ is a one clock time, then $T_L$ represents a time that is equal to the sum of an average time required to read data from the CRC conversion table and one clock for XOR calculations, assuming that the reading of data from memory 3 and XOR calculations are performed by pipeline processing. The time $T_L$ is expressed by:

$$T_L = (_{16}C_1 + 2*_{16}C_2 + 3*_{16}C_3 + \ldots + 16*_{16}C_{16})/(2^{16}-1) + 1$$

$$= 9 \text{ (clock times)}$$

where $_pC_q$ represents a combination for selecting q from p.

Since $T_C$ indicates that the calculation of a CRC by reading one word from the memory is repeated as many times as the length of the word, it represents clock times (1024 clock times) required to read 1024 words.

When the bit length of the variable field is large, M is very large, and $$T_1/T_0 = (T_R + T_C + T_L * M)/(T_R + T_C * M)$$

$$\approx T_L/T_C$$

Therefore, for transmission data with a 16-bit CRC added to the data of 1 k words, $$T_1/T_0 = 9/1024$$

$$\approx 1/114$$

Consequently, the CRC code generating method according to the first embodiment which is illustrated in FIGS. 8 and 9 is capable of reducing the processing time much more than the conventional method. The size V of CRC conversion table 31 which is used to realize the method according to the present embodiment is expressed by:

V=(the bit length of the variable field)*(the data length of the corrective value E)

for a different bit length L of data field.

Figure 11:
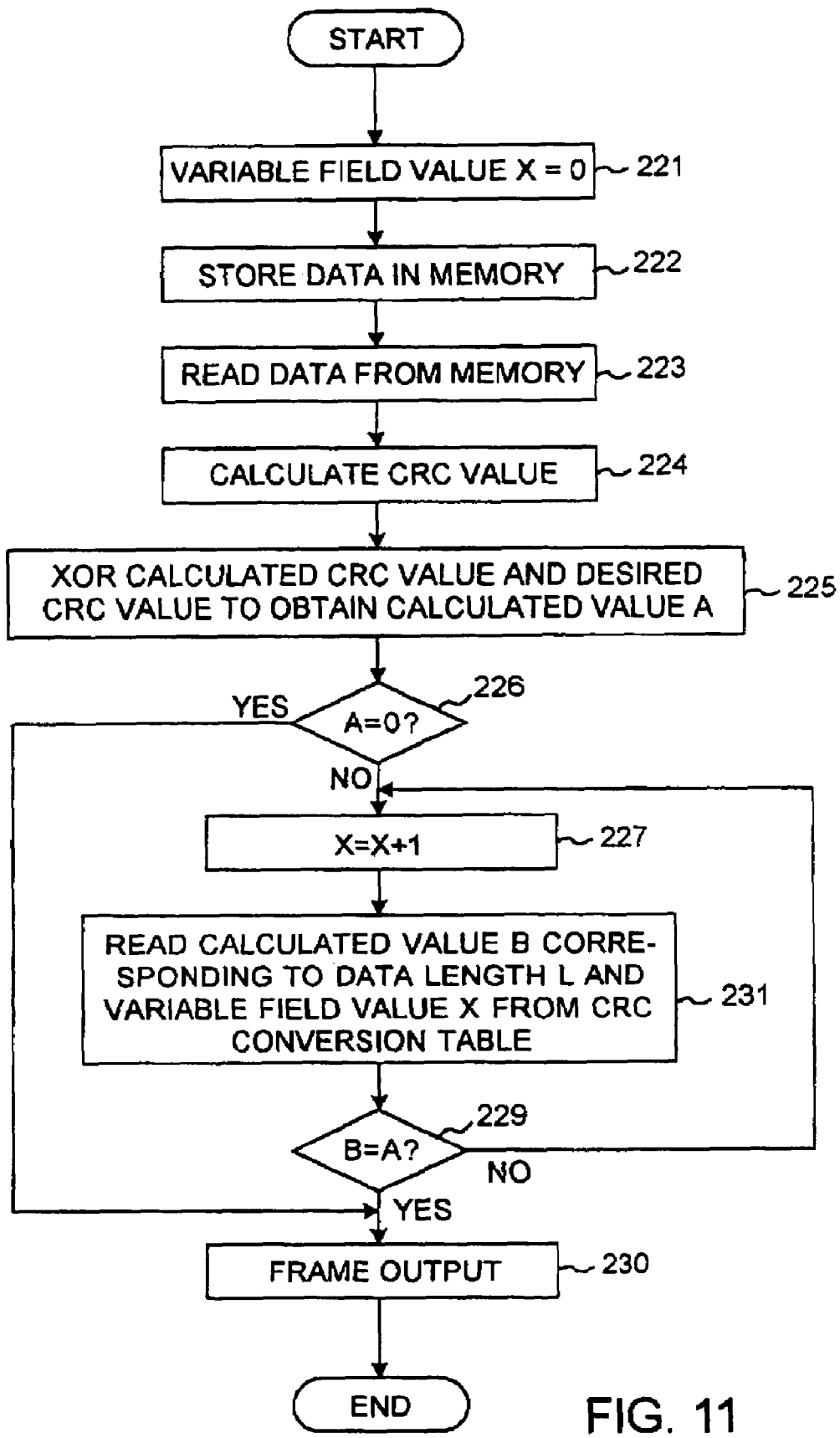
FIG. 11 is a flowchart showing a CRC code generating process according to a second embodiment of the present invention.

A CRC code generating method according to a second embodiment of the present invention will be described below. FIG. 11 shows a sequence of the code generating method according to the second embodiment. As shown in FIG. 11, the sequence of the second embodiment is similar to the sequence of the first embodiment, but differs therefrom in that step 228 for calculating a calculated value B is replaced with step 231 for reading a calculated value B. According to the second embodiment, memory 3 of transmitting apparatus 1 stores CRC conversion table 61.

According to the second embodiment, in step 221, a variable field value X of transmission data is initialized to "0". In step 222, the transmission data is stored in memory 3. In step 223, the transmission data is read from memory 3. In step 224, CPU 2 calculates a CRC value with respect to the transmission data. Thereafter, in step 225, CPU 2 XORs the CRC value with respect to the transmission data whose variable field value is "0, and a desired CRC value, and saves the calculated result as a calculated value A.

In step 226, CPU 2 determines whether the calculated value A is 0 or not. If the calculated value A is 0, then since the desired CRC value has been obtained, control jumps to step 230. If the calculated value A is not 0, then, in step 227, CPU 2 increments the variable field value X to establish data for use temporarily as the variable field value X in following steps. After step 227, in step 231, CPU 2 accesses CRC conversion table 61 in memory 3 using an address represented by the bit length (data length) L of a data field, and the variable field value X, and reads a calculated value B stored in the corresponding address in CRC conversion table 61. After having read the calculated value B, CPU 2 compares the calculated value B with the calculated value A in step 229. If the calculated value B is equal to the calculated value A, then control goes to step 230. If the calculated value B is not equal to the calculated value A, then control goes back to step 227. In step 230, the data is output in the sequence of the transmission frame to serial transmitting unit 4 under the control of CPU 2. As a result, the serial transmission data TD is transmitted from serial transmitting unit 4 to a serial transmission path.

Figure 12:
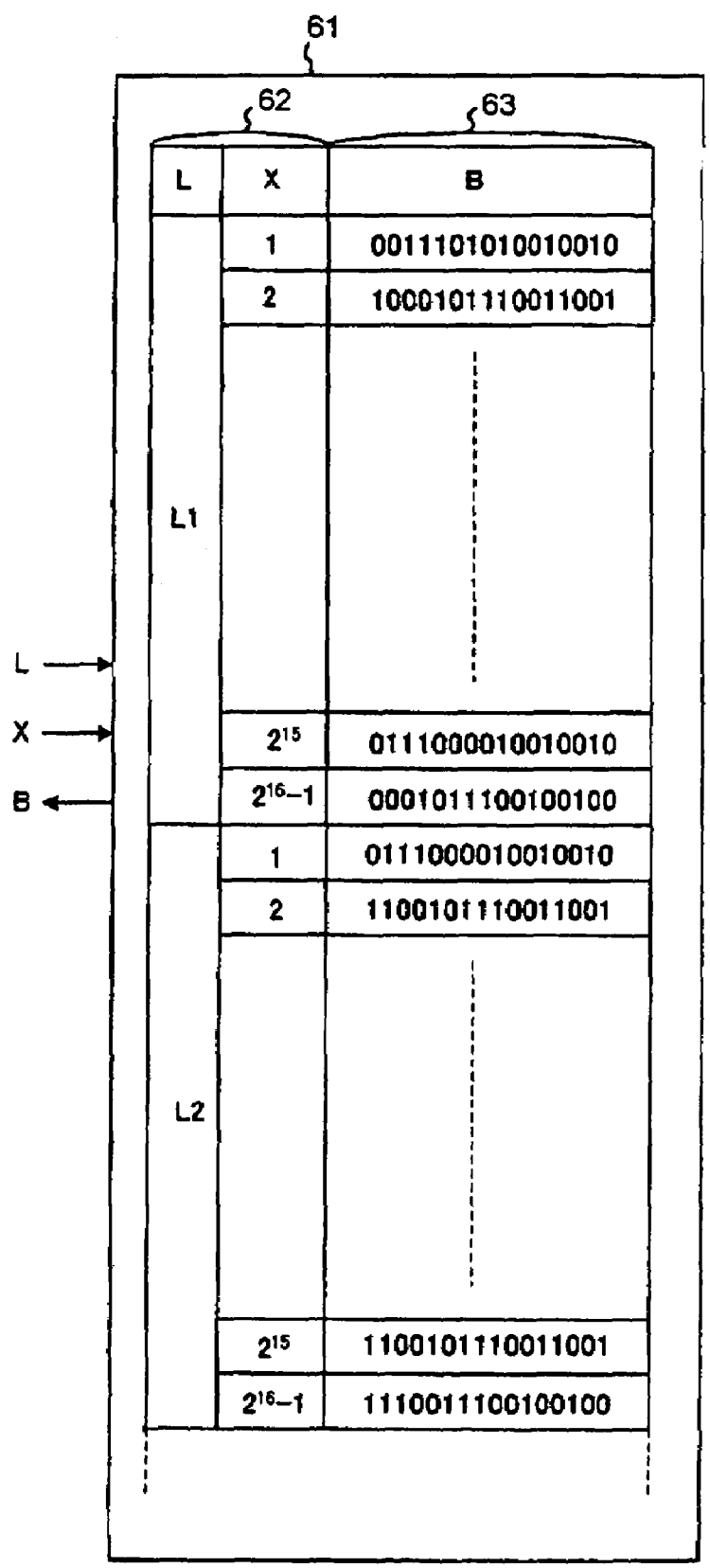
FIG. 12 is a diagram showing an example of a CRC conversion table used in the case of a variable field of a 16-bit length in the second embodiment.

CRC conversion table 61 according to the second embodiment will be described in detail below. FIG. 12 shows by way of example an arrangement of CRC conversion table 61 where the variable field is 16 bits long.

CRC conversion table 61 stores calculated values B as calculated value data 63 corresponding to addresses 62 represented by the bit lengths L of data fields and the variable field values X. If K is an integer that is equal to or greater than 1 and equal to or less than 16 representing the bit length of the variable field, then a calculated value B can be calculated one by one as it is produced by XORing a CRC value at the time the variable field value X is 0 and a CRC value at the time the variable field value X is $2^K-1$. Practically, however, as with the first embodiment described above with reference to FIG. 10, it requires a smaller amount of calculations and is more efficient to determine a calculated value B corresponding to the variable field value X from a CRC conversion table storing corrective values according to a formula for the calculated value B, and thereafter to directly read the calculated value B from the table using the address 62 represented by the bit length L of the data field and the variable field value X.

In FIG. 12, CRC conversion table 61 contains a plurality of low-level tables where calculated values B are stored as calculated value data in association with respective variable field values X corresponding to low-order addresses. One of the low-level tables is selected depending on the bit length L of a data field which corresponds to a high-order address. With CRC conversion table 61 being thus arranged, a plurality of data having different bit lengths can be processed without the need for generating a new table.

Figure 13:
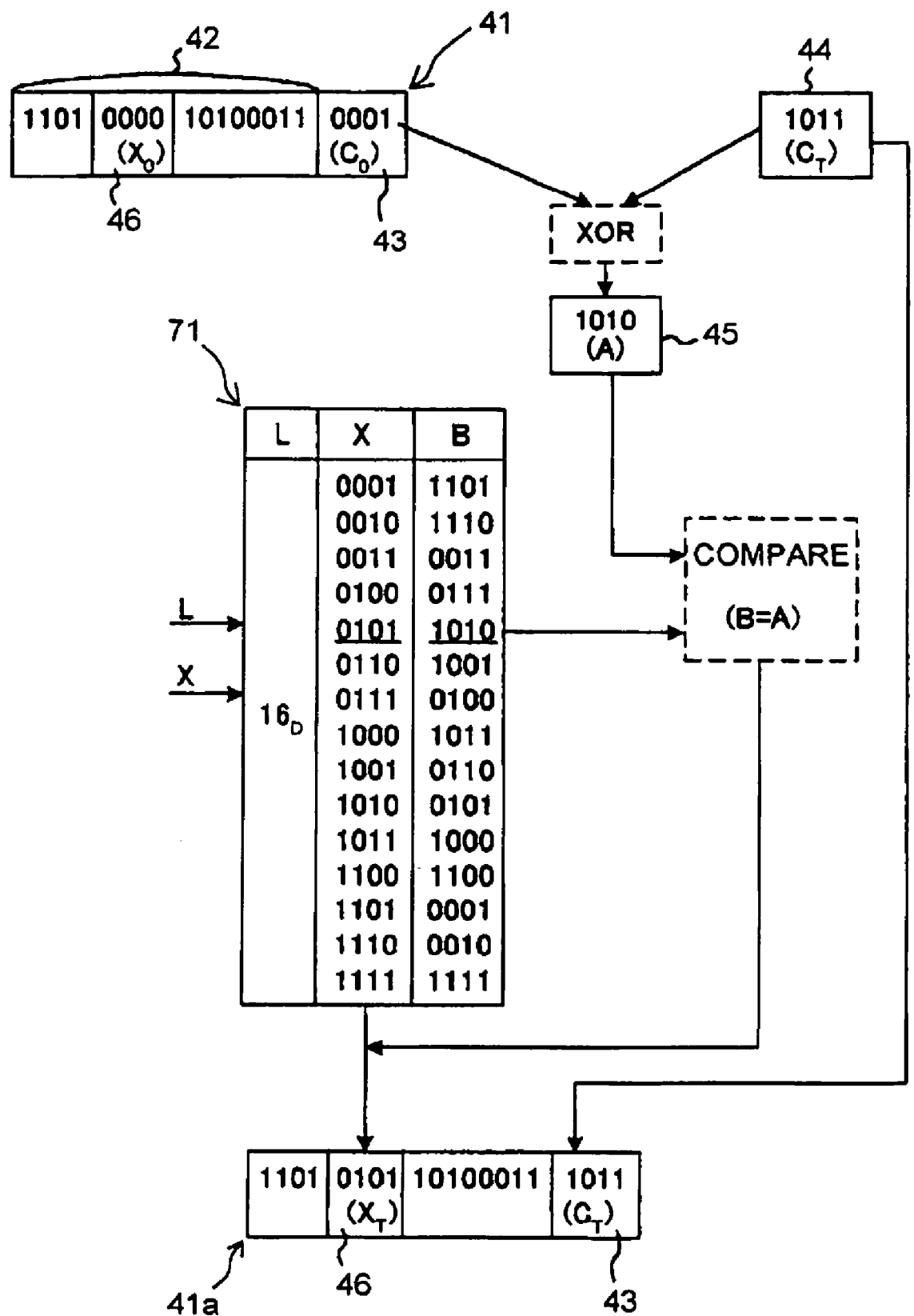
FIG. 13 is a diagram illustrative of the CRC code generating process according to the second embodiment.

FIG. 13 shows processing details and data flows in the steps of the CRC code generating process according to the second embodiment. It is assumed in FIG. 13, as with FIG. 8, that transmission frame 41 contains data field 42 having a bit length L of 16 bits and CRC field 43 having a bit length L of 4 bits, and data field 42 includes variable field 46 having a length of 4 bits. The EOF field is omitted from illustration in FIG. 13 as it has no bearing on the CRC code generating process. The CRC code generating process will be described in detail below with reference to a comparison between FIG. 11 and FIG. 13.

When steps 221 to 224 shown in FIG. 11 have been executed, as indicated by transmission frame 41 shown in FIG. 13, the variable field value X of variable field 46 is an initial value $X_0$ (="0000") and the CRC value of CRC field 43 thereof which is calculated based on the data of data field 42 according to the generator polynomial is $C_0$ (="0001"). If desired CRC value 44 is $C_T$ (="1011"), then the calculated value A (45) determined by XORing $C_0$ and $C_T$ is "1010" in step 225. Since the calculated value A is not "0000" in step 226, control goes to step 227. In step 227, the variable field value X is incremented to the variable field value X="0001". The processing up to this point is the same as the processing shown in FIG. 10.

In step 231, a calculated value B which is stored in CRC conversion table 71 in advance is read at an address represented by the bit length L of the data field and the variable field value X. Since X="0001", B="1101" stored at the variable field value X="0001" in CRC conversion table 71 is read. As the calculated value B (="1101") is not equal to the calculated value A (="1010") in step 229, control returns from step 229 to step 227.

In the same manner as described with reference to FIG. 10, the processing from steps 227 to 229 is repeated. When steps 227 to 229 are executed in the second, third, and fourth cycles, the variable field value X becomes "0010", "0011", and "0100", respectively, and corresponding calculated values B of "1110", "0011", and "0111" are read from CRC conversion table 71. Since these calculated values B are not equal to the calculated value A in step 229, control returns from step 229 to step 227.

When steps 227 to 229 are executed in the fifth cycle, the variable field value X becomes "0101" in step 227, and "1010" is then read as a calculated value B from CRC conversion table 71 in step 231. Since the calculated value B is judged as being equal to the calculated value A in step 229, the variable field value X at this time is set to a variable field value $X_T$ corresponding to a desired CRC value $C_T$, and control goes to step 230. In step 230, the data of variable field 46 in transmission frame 41 is replaced with $X_T$ (="0101"), the CRC value of CRC field 43 is replaced with the desired CRC value $C_T$ (="1011"), and the entire data are output as transmission frame 41a.

According to the second embodiment, as described above, a variable field value $X_T$ can be determined such that the desired CRC value $C_T$ and the data of data field 42 will not conflict with each other and an unmatched error will not be caused.

A time $T_2$ that is required to obtain a variable field value $X_T$ corresponding to a desired CRC value $C_T$ according to the second embodiment is estimated by:

$$T_2 = T_R + T_C + T_R * M$$

If it is assumed that the variable field length is 16 bits long, with respect to transmission data with a 16-bit CRC added to the data of 1 k words, the ratio of the time $T_2$ to the calculating time $T_0$ according to the conventional process is expressed, as the same manner in the first embodiment, provided M is sufficiently large, by:

$$T_2/T_0 = (T_R + T_C + T_R * M)/(T_R + T_C * M)$$
$$\approx T_R/T_C$$

Therefore, for transmission data with a 16-bit CRC added to the data of 1 k words, $$T_2/T_0 \approx 1/1024$$

Consequently, the CRC code generating method according to the second embodiment is capable of reducing the processing time much more than the CRC code generating method according to the first embodiment.

Figure 14:
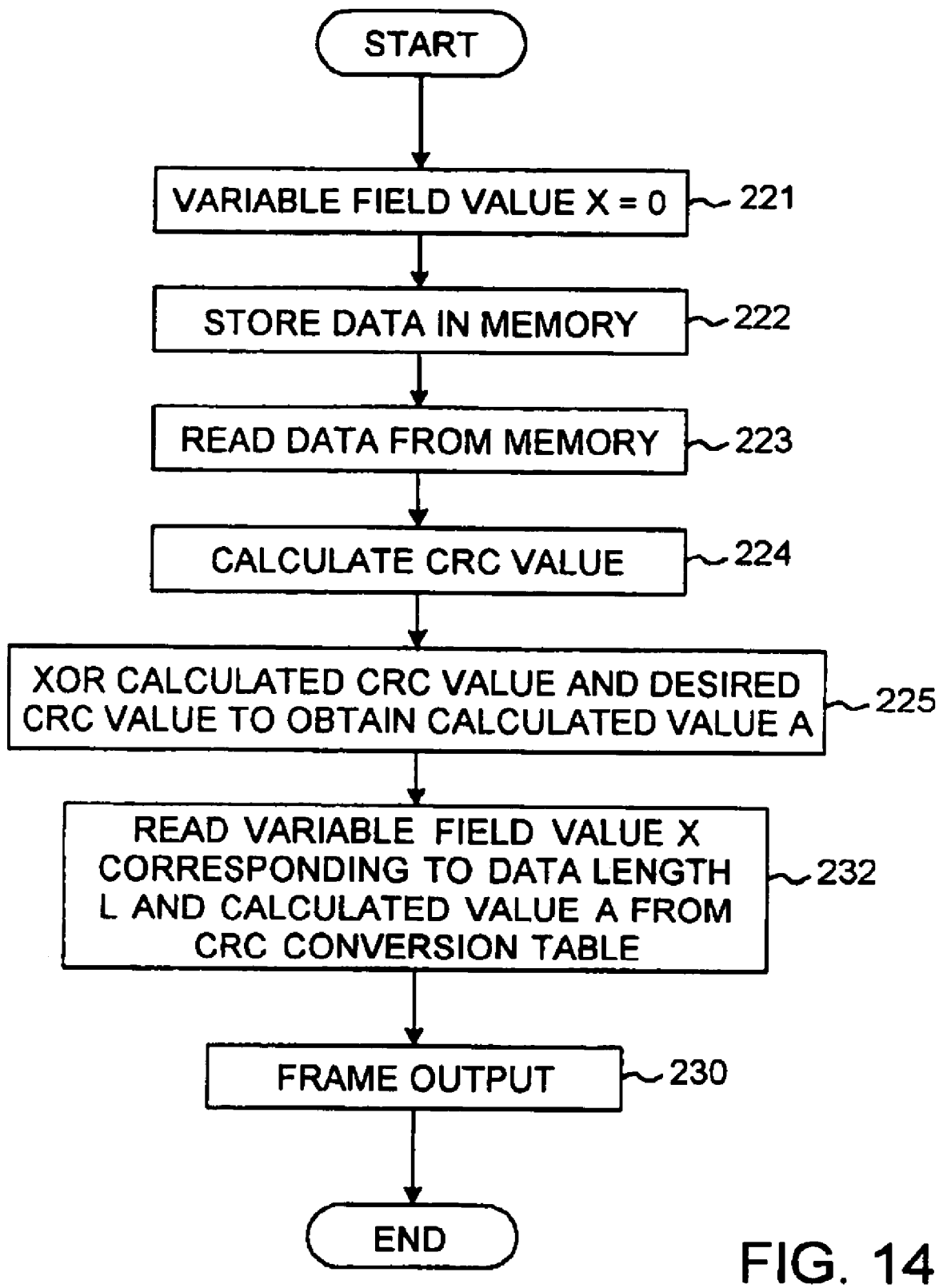
FIG. 14 is a flowchart showing a CRC code generating process according to a third embodiment of the present invention.

A CRC code generating method according to a third embodiment of the present invention will be described below. FIG. 14 shows a sequence of the code generating method according to the third embodiment. As shown in FIG. 14, the sequence of the third embodiment is different from the sequence of the second embodiment shown in FIG. 11 in that steps 226, 227, 231, and 229 of the sequence of the second embodiment are deleted, and step 232 is inserted. According to the third embodiment, memory 3 of transmitting apparatus 1 stores CRC conversion table 91.

With the sequence according to the third embodiment as shown in FIG. 14, in step 221, a variable field value X of transmission data is initialized to "0". In step 222, the transmission data is stored in memory 3. In step 223, CPU 2 reads the transmission data from memory 3. In step 224, CPU 2 calculates a CRC value with respect to the transmission data. In step 225, CPU 2 XORs the CRC value with respect to the transmission data whose variable field value is "0" and a desired CRC value, and saves the calculated result as a calculated value A.

In step 232, CPU 2 accesses CRC conversion table 91 in memory 3 using an address represented by the bit length (data length) L of a data field, and the variable field value X, and reads a variable field value X stored in the corresponding address in CRC conversion table 91. Thereafter, in step 230, a transmission frame including the read variable field value X and the desired CRC value is assembled and output from serial transmitting unit 4 to the serial transmission path under the control of CPU 2.

Figure 15:
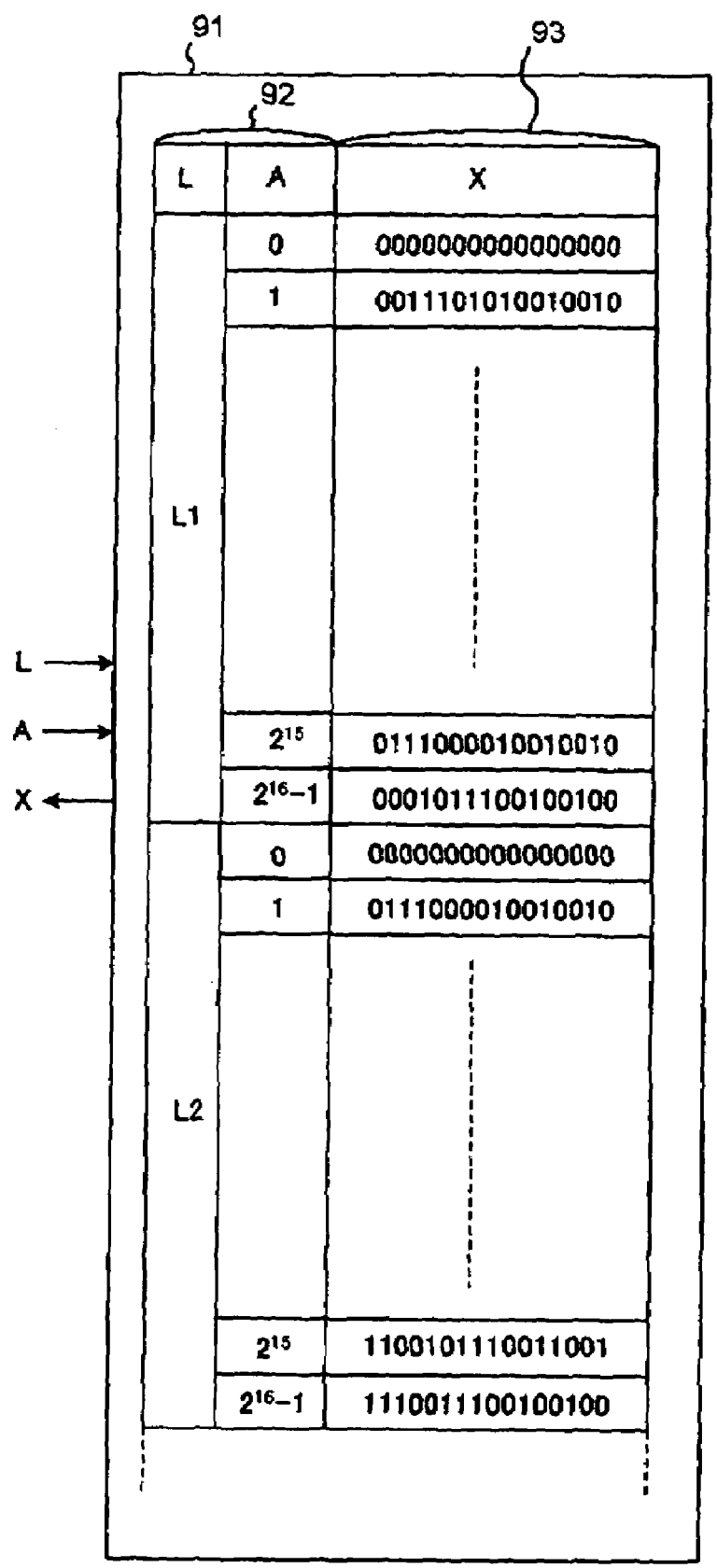
FIG. 15 is a diagram showing an example of a CRC conversion table used in the case of a variable field of a 16-bit length in the third embodiment.

An arrangement of CRC conversion table 91 according to the third embodiment will be described below. FIG. 15 shows by way of example an arrangement of CRC conversion table 91 where the variable field is 16 bits long. CRC conversion table 91 stores variable field values X as calculated value data 93 corresponding to addresses 92 represented by the bit lengths L of data fields and the calculated values A. This CRC conversion table 91 is generated by rearranging fields such that the variable field values X correspond to the order of the calculated values B, in CRC conversion table 61 according to the second embodiment shown in FIG. 12, and reading the calculated values B as calculated values A. It is possible to read a variable field value corresponding to a calculated value A directly from CRC conversion table 91 by accessing CRC conversion table 91 at an address represented by the bit length L of the data field and the calculated value A.

In FIG. 15, CRC conversion table 91 contains a plurality of low-level tables where variable field values X are stored as variable field data 93 in association with respective calculated values B corresponding to low-order addresses. One of the low-level tables is selected depending on the bit length L of a data field which corresponds to a high-order address. With CRC conversion table 91 being thus arranged, a plurality of data having different bit lengths can be processed without the need for generating a new table.

Figure 16:
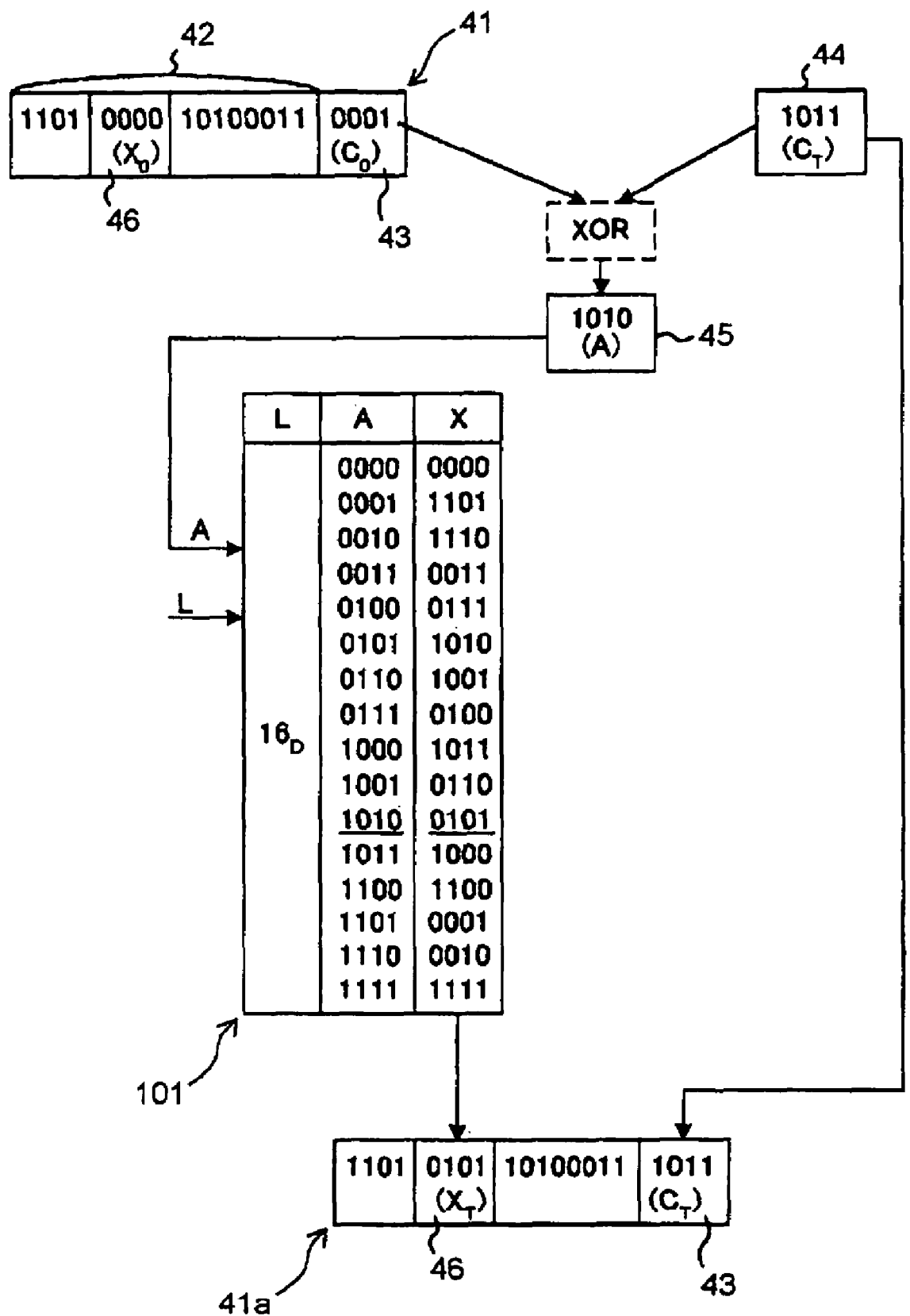
FIG. 16 is a diagram illustrative of the CRC code generating process according to the third embodiment.

FIG. 16 shows processing details and data flows in the steps of the CRC code generating process according to the third embodiment. It is assumed in FIG. 16, as with FIG. 13, that transmission frame 41 contains data field 42 having a bit length L of 16 bits and CRC field 43 having a bit length L of 4 bits, and data field 42 includes variable field 46 having a length of 4 bits. The EOF field is omitted from illustration in FIG. 16 as it has no bearing on the CRC code generating process. The CRC code generating process will be described in detail below with reference to a comparison between FIG. 14 and FIG. 16.

When steps 221 to 224 shown in FIG. 14 have been executed, as indicated by transmission frame 41 shown in FIG. 16, the variable field value X of variable field 46 is an initial value $X_0$ (="0000") and the CRC value of CRC field 43 thereof which is calculated based on the data of data field 42 according to the generator polynomial is $C_0$ (="0001"). If desired CRC value 44 is $C_T$ (="1011"), then the calculated value A (45) determined by XORing $C_0$ and $C_T$ is "1010" in step 225. In step 232, CRC conversion table 101 is accessed at an address represented by the bit length L of the data field and the calculated value A (="1010"), and a variable field value X which is stored in advance in the address in CRC conversion table 101 is read from CRC conversion table 101. Since the read variable field value X is guaranteed to be the variable field value $X_T$ corresponding to the desired CRC value $C_T$, control goes to step 230. In step 230, the CRC value of CRC field 43 is replaced with the desired CRC value $C_T$ (="1011"), and the entire data are output as transmission frame 41a.

According to the third embodiment, as described above, a variable field value $X_T$ can be determined such that the desired CRC value $C_T$ and the data of data field 42 will not conflict with each other and an unmatched error will not be caused.

A time $T_3$ that is required to obtain a variable field value $X_T$ corresponding to a desired CRC value $C_T$ according to the third embodiment is estimated by:

$$T_3 = T_R + T_C + T_R$$

If it is assumed that the variable field length is 16 bits long, then with respect to transmission data with a 16-bit CRC added to the data of 1 k words, the ratio of the time $T_3$ to the calculating time $T_0$ according to the conventional process is expressed, as with the first embodiment, by:

$$T_3/T_0 = (T_R + T_C + T_R)/(T_R + T_C * M)$$
$$\approx T_R/T_C$$

If the variable field length is of 16 bits, then the average number M of repetitions required to obtain a calculated value B that is in agreement with the calculated value A is about half $2^{16}$, i.e., about $2^{15}$. Therefore, for transmission data with a 16-bit CRC added to the data of 1 k words, $$T_3/T_0 = (1 + 1 + 1024)/(1 + 1024 * 2^{15})$$
$$\approx 1/32768$$

Consequently, the CRC code generating method according to the third embodiment is capable of reducing the processing time much more than the CRC code generating method according to the second embodiment.

Figure 17:
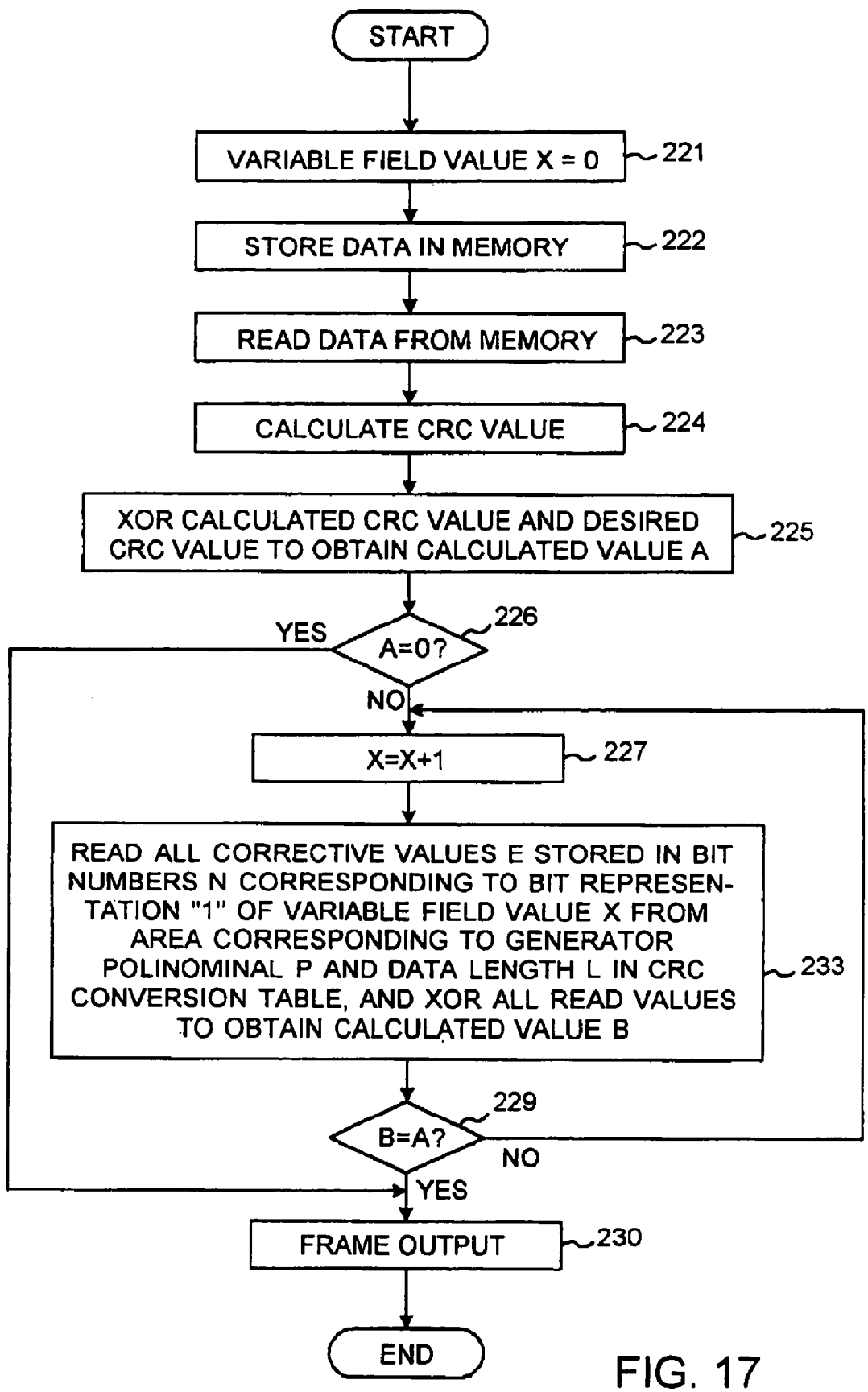
FIG. 17 is a flowchart showing a CRC code generating process according to a fourth embodiment of the present invention.

FIG. 17 shows a sequence of a CRC code generating process according to a fourth embodiment of the present invention. According to the fourth embodiment, the bit length L of a data field, a bit number N in a variable field, and a generator polynomial P for use in generating a CRC value are used as address indexes for a CRC conversion table that is accessed by CPU 2. The CRC conversion table according to the fourth embodiment outputs corrective values E as with the first and second embodiments. Memory 3 stores such CRC conversion table 131. The sequence shown in FIG. 17 is different from the sequence according to the first embodiment shown in FIG. 8 in that step 228 is deleted and step 233 is inserted.

According to the fourth embodiment, in step 221, a variable field value X of transmission data is initialized to "0". In step 222, the transmission data is stored in memory 3. In step 223, CPU 2 reads the transmission data from memory 3. In step 224, CPU 2 calculates a CRC value corresponding to the transmission data. Thereafter, in step 225, CPU 2 XORs the CRC value corresponding to the transmission data with the variable field value being "0" and a desired CRC value, and saves the calculated result as a calculated value A.

In step 226, CPU 2 determines whether the calculated value A is 0 or not. If the calculated value A is 0, then since the desired CRC value has been obtained, control jumps to step 230. If the calculated value A is not 0, then control goes to step 227. In step 227, the variable field value X is incremented to establish data for use temporarily as the variable field value X in following steps. After step 227, in step 233, CPU 2 accesses CRC conversion table 131 in memory 3 using addresses represented by a generator polynomial P, the bit length (data length) L of a data field, and bit numbers corresponding to a bit representation "1" in the variable field value X. CPU 2 reads corrective values E stored in all the corresponding addresses in CRC conversion table 131, and XORs the read corrective values E to produce a calculated value B. After having produced the calculated value B, CPU 2 compares the calculated value B with the calculated value A in step 229. If the calculated value B is equal to the calculated value A, then control goes to step 230. If the calculated value B is not equal to the calculated value A, then control goes back to step 227. In step 230, the data is output in the sequence of the transmission frame to serial transmitting unit 4 under the control of CPU 2. As a result, the serial transmission data TD is transmitted from serial transmitting unit 4 to the serial transmission path.

Figure 18:
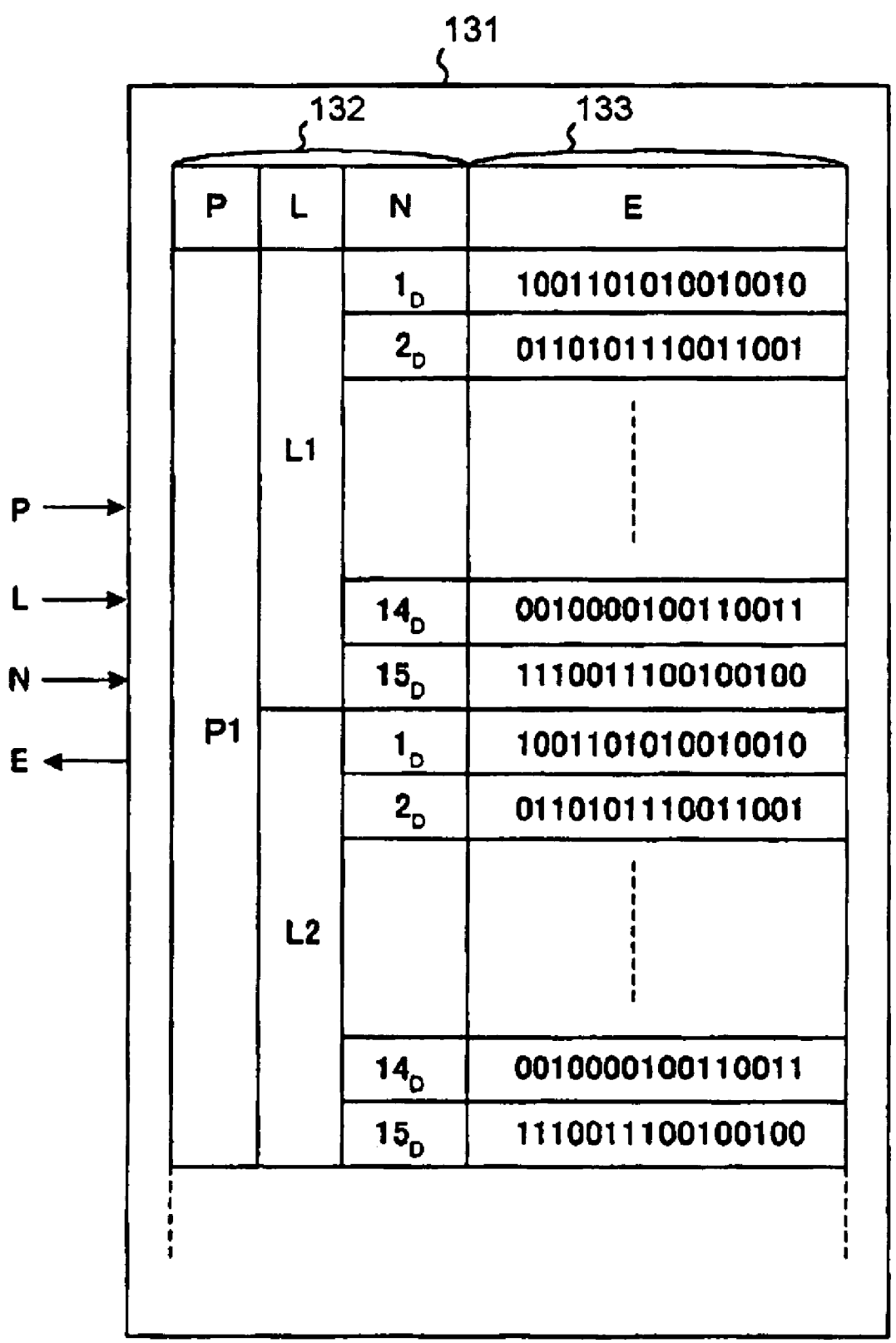
FIG. 18 is a diagram showing an example of a CRC conversion table used in the case of a variable field of a 16-bit length in the fourth embodiment.

CRC conversion table 131 used in the fourth embodiment will be described in detail below. FIG. 18 shows by way of example an arrangement of CRC conversion table 131 where the bit length of the variable field is of 16 bits.

In FIG. 18, CRC conversion table 131 contains indexes 132 of addresses corresponding to generator polynomials P, bit lengths L of data fields, and bit numbers N that are input. CRC conversion table 131 also contains fields 133 of corrective value data E, as with fields 33 shown in FIG. 9. Corrective value data E serve to indicate a bit to be inverted in a variable field value X as "1".

As with the method using the variable field, it is possible to specify a bit affected by the generator polynomial by changing the coefficients of the respective degrees of the generator polynomial. If the generator polynomial P(X) is expressed by $P(X)=X^2+1$, then P="101" may be input to CRC conversion table 131. As with the previous embodiments described above, readout addresses are represented by generator polynomials P, bit lengths L of data fields, and bit numbers N, and corresponding corrective value data 133 are stored in advance in CRC conversion table 131, so that calculated values B can be determined from CRC conversion table 131.

In FIG. 18, CRC conversion table 131 contains a plurality of low-level tables where corrective values E are stored as corrective value data 133 in association with respective bit numbers N which correspond to low-order addresses. One of the low-level tables is selected depending on the generator polynomial P and the bit length L of a data field which correspond to a high-order address. With CRC conversion table 131 being thus arranged, a combination of different generator polynomials and a plurality of data having different bit lengths can be processed without the need for generating a new table.

In the above description, generator polynomials P are added to the addresses in the first embodiment. Similarly, the second embodiment may easily be modified to include generator polynomials P in the addresses. Specifically, in FIG. 12, the addresses 62 in CRC conversion table 62 may be changed so as to be determined by generator polynomials P, bit lengths L of data fields, and variable field values X, and calculated values B corresponding to generator polynomials P, bit lengths L of data fields, and variable field values X may be read from the CRC conversion table in step 231 shown in FIG. 11. With generator polynomials included in the addresses in the second embodiment, it is possible to determine variable field values such that the desired CRC value and the data of the data field will not conflict with each other and an unmatched error will not be caused, even when generator polynomials for CRC values are changed. The modified sequence can process data at a high speed which is the same as with the second embodiment.

Similarly, the third embodiment may easily be modified to include generator polynomials P in the addresses. Specifically, the addresses 92 shown in FIG. 15 may be changed so as to be determined by generator polynomials P, bit lengths L of data fields, and calculated values A, and variable field values X corresponding to generator polynomials P, bit lengths L of data fields, and calculated values A may be read from the CRC conversion table in step 232 shown in FIG. 14. With generator polynomials included in the addresses in the third embodiment, it is possible to determine variable field values such that the desired CRC value and the data of the data field will not conflict with each other and an unmatched error will not be caused, even when generator polynomials for CRC values are changed. The modified sequence can process data at a high speed which is the same as with the third embodiment.

While preferred embodiments of the present invention have been described using specific terms, such description is for illustrative purposes only, and it is to be understood that changes and variations may be made without departing from the spirit or scope of the following claims.

What is claimed is:

1. A method to determine a value of a V-bit variable field so that a CRC value calculated based on a data field including the variable field according to a generator polynomial is equal to a desired CRC value, comprising the steps of:

establishing a temporary variable field value;

reading from a conversion table all corrective values which correspond to a bit number where a bit value of said temporary variable field value is 1, and exclusive-ORing the read corrective values to calculate a first calculated value, wherein each said corrective value in the conversion table corresponds to a given bit number in the variable field, each said corrective value identifying those bits in the CRC calculated based on the data field whose value is changed when a single bit in the given bit number in the variable field is changed; and determining, when said first calculated value corresponds to the desired CRC value, said temporary variable field value to be a variable field value for obtaining the desired CRC value.

2. The method according to claim 1, wherein each of the corrective values corresponds to a bit number N, each of the corrective values being produced by exclusive-ORing a CRC value of the data field for which the variable field value is 0 and a CRC value of the data field for which the variable field value is $2^N$, said table having a high-order address represented by a bit length of the data field and a low-order address represented by the bit number N, N representing an integer equal to or greater than 0 and less than the bit length of the variable field.

3. The method according to claim 1, wherein each of the corrective values corresponds to a bit number N, each of the corrective values being produced by exclusive-ORing a CRC value of the data field for which the variable field value is 0 and a CRC value of the data field for which the variable field value is $2^N$, said table having a high-order address represented by the generator polynomial for the CRC code and a bit length of the data field and a low-order address represented by the bit number N, N representing an integer equal to or greater than 0 and less than the bit length of the variable field.

4. The method according to claim 1, wherein said step of determining said temporary variable field value comprises the steps of:
  comparing the first calculated value with a second calculated value, the second calculated value being calculated in advance by exclusive-ORing a CRC value of the data field for which the variable field value is 0 and the desired CRC value; and
  determining a temporary variable field value corresponding to said first calculated value as a variable field value for obtaining said desired CRC value if said first calculated value and said second calculated value agree with each other.

5. The method according to claim 4, wherein each of the corrective values corresponds to a bit number N, each of the corrective values being produced by exclusive-ORing a CRC value of the data field for which the variable field value is 0 and a CRC value of the data field for which the variable field value is $2^N$, said table having a high-order address represented by a bit length of the data field and a low-order address represented by the bit number N, N representing an integer equal to or greater than 0 and less than the bit length of the variable field.

6. The method according to claim 4, wherein each of the corrective values corresponds to a bit number N, each of the corrective values being produced by exclusive-ORing a CRC value of the data field for which the variable field value is 0 and a CRC value of the data field for which the variable field value is $2^N$, said table having a high-order address represented by the generator polynomial for the CRC code and a bit length of the data field and a low-order address represented by the bit number N, N representing an integer equal to or greater than 0 and less than the bit length of the variable field.

7. A method of generating a CRC code to determine a variable field value for equalizing a CRC value, which is calculated based on data including the variable field value of a variable field included in a data field according to a generator polynomial, to a desired CRC value, comprising the steps of:
  establishing a temporary variable field value;
  reading a first calculated value corresponding to said temporary variable field value from a conversion table which stores therein first calculated values corresponding to a variable field value X and produced by exclusive-ORing a CRC value where the variable field value is 0 and a CRC value where the variable field value is X, where X represents an integer equal to or greater than 1 and equal to or less than $2^K-1$ where K represents a bit length of the variable field; and
  determining, when the read first calculated value corresponds to the desired CRC value, said temporary variable field value to be a variable field value for obtaining the desired CRC value.

8. The method according to claim 7, wherein said conversion table comprises a table which stores data of said first calculated values corresponding to said variable field value X and has a high-order address represented by a bit length of the data field and a low-order address represented by the variable field value X.

9. The method according to claim 7, wherein said conversion table comprises a table which stores data of said first calculated values corresponding to said variable field value X and has a high-order address represented by the generator polynomial and a bit length of the data field and a low-order address represented by the variable field value X.

10. The method according to claim 7, wherein said step of determining said temporary variable field value comprises the steps of:
  comparing a second calculated value which is calculated in advance by exclusive-ORing a CRC value where the variable field value is 0 and the desired CRC value, with a first calculated value; and
  determining a temporary variable field value corresponding to said first calculated value as a variable field value for obtaining said desired CRC value if said first calculated value and said second calculated value agree with each other.

11. The method according to claim 10, wherein said conversion table comprises a table which stores data of said first calculated values corresponding to said variable field value X and has a high-order address represented by a bit length of the data field and a low-order address represented by the variable field value X.

12. The method according to claim 10, wherein said conversion table comprises a table which stores data of said first calculated values corresponding to said variable field value X and has a high-order address represented by the generator polynomial and a bit length of the data field and a low-order address represented by the variable field value X.

13. A method of generating a CRC code to determine a variable field value for equalizing a CRC value, which is calculated based on data including the variable field value of a variable field included in a data field according to a generator polynomial, to a desired CRC value, comprising the steps of:
  calculating a first calculated value by exclusive-ORing a CRC value where the variable field value is 0 and the desired CRC value; and
  reading a variable field value corresponding to a second calculated value equal to said first calculated value, as a variable field value for obtaining said desired CRC value, from a conversion table which stores therein variable field values X corresponding to second calculated values, wherein each of said second calculated values is produced by exclusive-ORing a CRC value where the variable field value is 0 and a CRC value where the variable field value is X, where X represents an integer equal to or greater than 1 and equal to or less than $2^K-1$ where K represents a bit length of the variable field.

14. The method according to claim 13, wherein said conversion table comprises a table which stores data of said variable field values corresponding to said second calculated values and has a high-order address represented by a bit length of the data field and a low-order address represented by said second calculated values.

15. The method according to claim 13, wherein said conversion table comprises a table which stores data of said variable field values corresponding to said second calculated values and has a high-order address represented by the generator polynomial and a bit length of the data field and a low-order address represented by said second calculated values.

16. A method of generating data for forming a desired CRC code determining a variable field value of a variable field included in a data field so that a CRC value which is calculated based on data including the variable field value according to a generator polynomial, is equalized to said desired CRC value, the method comprising:

a first step of determining a first bit position data which is a position data indicating a bit at which a bit value is different between a fundamental CRC value and said desired CRC value, said fundamental CRC value is a CRC value which is obtained when the variable field value is set to "0";

a second step of generating a conversion table which stores a second bit position data corresponding to at least a specific bit number, said second bit position data being a position data indicating a bit at which a bit value is different between said fundamental CRC value and a CRC value which is obtained when a bit value of a bit at said specific bit number in the variable field is set to "1"; and a third step of determining, when a data obtained by combining the second bit position data using said conversion table agrees with said first bit position data, a variable field value having bit of "1" only at a bit number corresponding to said second bit position data which is used in the combining to be a variable field value for obtaining the desired CRC value.

17. The method according to claim 16, wherein:

said second step comprises the steps of:

obtaining as a corrective value for each bit number a position data of a bit at which the CRC value which is obtained when a bit value of a bit at said specific bit number in the variable field is set to "1" differs from a CRC value in a case of the variable field value of "0," and generating the conversion table which stores each corrective value corresponding to at least the bit number, and said third step comprises the steps of:

sequentially varying the variable field value to read the corrective value which corresponds to a bit number at which said varied variable field value is "1,"

when a number of bits of "1" at a same bit number where all the read corrective value are all "1" is an even number, obtaining a data in which only a bit corresponding to said same bit number is set to "1", and determining, when said data agrees with said first bit position data, a variable field value corresponding to said data to be the variable field value for obtaining the desired CRC value.

18. A method of generating data for forming a desired CRC code determining a variable field value of a variable field included in a data field so that a CRC value which is calculated based on data including the variable field value according to a generator polynomial, is equalized to said desired CRC value, the method comprising:

a first step of determining a first bit position data which is a position data indicating a bit at which a bit value is different between a fundamental CRC value and said desired CRC value, said fundamental CRC value is a CRC value which is obtained when the variable field value is set to "0";

a second step of obtaining for each variable field value a second bit position data, which is a position data of a bit at which a CRC value in a case of the variable field value being varied differs from a CRC value in a case of the variable field value of "0", to generate a conversion table which stores each second bit position data corresponding to at least said varied variable field value; and a third step of sequentially varying the variable field value to read the second bit position data corresponding to said varied variable field value, and determining, when the read second position data agrees with said first bit position data, a variable field value corresponding to the read second bit position data to be a variable field value for obtaining the desired CRC value.

19. A method to determine a value of a V-bit variable field so that a CRC value calculated based on a data field including the variable field according to a generator polynomial is equal to a desired CRC value, comprising the steps of:

a) determining a first calculated value that identifies those bit positions in $C_0$ that differ from bits in the same position in $C_T$, where $C_0$ is a CRC of the data field when the variable field is set to 0, and $C_T$ is the desired CRC;

b) providing a conversion table of a plurality of corrective values, each said corrective value corresponding to a given bit position in the variable field, each said corrective value indicating how a CRC generated from the data field with the variable field set to 0 except for the given bit position compares to $C_0$;

c) determining a test variable field value;

d) determining a second calculated value by reading from the conversion table all of the corrective values for which the given bit position corresponds to a bit position of the test variable field value set to 1, and performing an exclusive-OR of all the read corrective values to calculate a first calculated value if there are a plurality of such read corrective values, and if only one corrective value is read, setting that corrective value as the second calculated value;

e) comparing the first calculated value to the second calculated value;

f) if a condition of the first and second calculated values being equal is met, setting the current test variable field value as the variable field value in the data field, and if the condition is not met, setting the test variable field value to a different value, and repeating steps d)-f) until the condition is met.

20. The method of claim 19, wherein step a) comprises performing an exclusive-OR of $C_0$ and $C_T$.

21. The method of claim 20, wherein each said corrective value is calculated as an exclusive-OR of:

1) $C_0$, and

2) CRC of the data field when the given bit position of the variable field is set to 1 and all other bit positions of the variable field are set to 0.

* * * * *